United States Patent
Seon et al.

(10) Patent No.: US 12,507,534 B2
(45) Date of Patent: Dec. 23, 2025

(54) DISPLAY PANEL AND DISPLAY APPARATUS INCLUDING THE SAME

(71) Applicant: Samsung Display Co., Ltd., Yongin-si (KR)

(72) Inventors: Jongbaek Seon, Yongin-si (KR); Deokhoi Kim, Yongin-si (KR); Jun Namkung, Yongin-si (KR); Joongsoo Moon, Yongin-si (KR); Hyungjun Park, Yongin-si (KR); Jaesung Lee, Yongin-si (KR); Changyong Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 558 days.

(21) Appl. No.: 17/903,972

(22) Filed: Sep. 6, 2022

(65) Prior Publication Data

US 2023/0073992 A1    Mar. 9, 2023

(30) Foreign Application Priority Data

Sep. 8, 2021    (KR) .................. 10-2021-0119854

(51) Int. Cl.
*H10K 59/123*    (2023.01)
*H10K 59/121*    (2023.01)
(Continued)

(52) U.S. Cl.
CPC ......... *H10K 59/123* (2023.02); *H10K 59/121* (2023.02); *H10K 59/1213* (2023.02); *H10K 59/124* (2023.02); *H10K 59/131* (2023.02)

(58) Field of Classification Search
CPC .. H10K 59/123; H10K 59/131; H10K 59/124; H10K 59/121; H10K 59/1213
See application file for complete search history.

(56) References Cited

U.S. PATENT DOCUMENTS

| 10,431,636 B2 | 10/2019 | Rappoport et al. |
| 11,063,091 B2 | 7/2021 | Kuo et al. |

(Continued)

FOREIGN PATENT DOCUMENTS

| CN | 110278300 A | 9/2019 |
| CN | 110729328 A | 1/2020 |

(Continued)

OTHER PUBLICATIONS

Extended European Search Report issued Jan. 16, 2023, in corresponding EP Patent Application No. 22188722.7 (12 pages).

*Primary Examiner* — Peter M Albrecht
(74) *Attorney, Agent, or Firm* — Womble Bond Dickinson (US) LLP

(57) ABSTRACT

A display panel includes: a substrate including a first display area in which a plurality of first display elements are arranged, and a second display area in which a plurality of second display elements are arranged; a plurality of first pixel circuits in the first display area; a plurality of second pixel circuits arranged outside of the second display area; a plurality of connection lines connecting the plurality of second display elements and the plurality of second pixel circuits; a first inorganic insulating layer arranged on the substrate; a lower-organic insulating layer arranged on the first inorganic insulating layer; and a second inorganic insulating layer arranged on the lower-organic insulating layer in the second display area, wherein the second inorganic insulating layer includes an opening exposing an upper surface of the lower-organic insulating layer.

20 Claims, 16 Drawing Sheets

(51) Int. Cl.
  *H10K 59/124*   (2023.01)
  *H10K 59/131*   (2023.01)

(56)         References Cited

U.S. PATENT DOCUMENTS

| | | |
|---|---|---|
| 11,424,306 B2 | 8/2022 | Jeon et al. |
| 2017/0345883 A1 | 11/2017 | Song et al. |
| 2021/0043717 A1 | 2/2021 | Park et al. |
| 2021/0193758 A1* | 6/2021 | Choi ............... H10K 59/123 |
| 2021/0200263 A1 | 7/2021 | Hu et al. |
| 2021/0335955 A1 | 10/2021 | Son et al. |
| 2021/0408184 A1* | 12/2021 | Hu ............... H10K 59/123 |
| 2022/0123094 A1 | 4/2022 | Qiu et al. |
| 2022/0149123 A1 | 5/2022 | Liang et al. |
| 2022/0208866 A1 | 6/2022 | Park et al. |

FOREIGN PATENT DOCUMENTS

| | | |
|---|---|---|
| CN | 111063719 A | 4/2020 |
| CN | 111129100 A | 5/2020 |
| CN | 111129102 A | 5/2020 |
| CN | 111710276 A | 9/2020 |
| CN | 111725287 A | 9/2020 |
| KR | 10-2020-0131400 A | 11/2020 |
| KR | 10-2021-0018572 A | 2/2021 |
| WO | 2021/147987 A1 | 7/2021 |

* cited by examiner

DISPLAY PANEL AND DISPLAY APPARATUS INCLUDING THE SAME

CROSS-REFERENCE TO RELATED APPLICATION

This application claims priority to and the benefit of Korean Patent Application No. 10-2021-0119854, filed on Sep. 8, 2021, in the Korean Intellectual Property Office, the entire content of which is incorporated herein by reference.

BACKGROUND

1. Field

One or more aspects of embodiments of the present disclosure relate to a display panel and a display apparatus including the display panel, and for example, to a display panel with an extended display area in which an image is displayed even in an area where a component such as an electronic element is arranged, and a display apparatus including the display panel.

2. Description of the Related Art

Recently, the usage of display apparatuses has diversified. For example, as display apparatuses have become thinner and more lightweight, the usage of display apparatuses has gradually expanded.

As display apparatuses are utilized for various suitable purposes, methods of designing shapes of display apparatuses are being developed, and the number of functions that may be combined with or linked to display apparatuses has increased.

SUMMARY

One or more aspects of embodiments of the present disclosure are directed toward a display panel with an extended display area to display an image even in an area where a component such as an electronic element is arranged, and a display apparatus including the display panel. However, this objective is an example and should not limit the scope of the present disclosure.

Additional aspects will be set forth in part in the description that follows and, in part, will be apparent from the description, or may be learned by practice of the embodiments of the present disclosure.

According to one or more embodiments, a display panel may include a substrate including a first display area including (e.g., in which) a plurality of first display elements, and a second display area including (e.g., in which) a plurality of second display elements, a plurality of first pixel circuits in the first display area and respectively connected to the plurality of first display elements, a plurality of second pixel circuits outside of the second display area and respectively connected to the plurality of second display elements, a plurality of connection lines connecting the plurality of second display elements and the plurality of second pixel circuits, a first inorganic insulating layer on the substrate, a lower-organic insulating layer on the first inorganic insulating layer, and a second inorganic insulating layer on the lower-organic insulating layer in the second display area, wherein the second inorganic insulating layer has an opening exposing an upper surface of the lower-organic insulating layer.

The plurality of connection lines may include a first connection line and a second connection line arranged on different layers (e.g., levels in a thickness direction) from each other, and the first connection line and the second connection line may include different materials from each other.

The first connection line may include a metal, and the second connection line may include a transparent conducting oxide.

The first connection line may include a conductive material included in the second pixel circuit.

The second pixel circuit may include a first thin-film transistor including a first gate electrode and a first semiconductor layer, the first semiconductor layer including a silicon semiconductor, and a second thin-film transistor including a second gate electrode and a second semiconductor layer, the second gate electrode being arranged on a different layer from a layer on which the first gate electrode is arranged, and the second semiconductor including an oxide semiconductor, and the first connection line may include a same material as at least one of the first gate electrode, the first semiconductor layer, the second gate electrode, or the second semiconductor layer.

The display panel may further include an upper-organic insulating layer on (e.g., covering) the second inorganic insulating layer, wherein a thickness of the upper-organic insulating layer in the second display area is less than a thickness of the upper-organic insulating layer in the first display area.

The display panel may further include an additional organic insulating layer in the second display area, wherein the additional organic insulating layer is not in the first display area.

The second display area may include a first sub area at a side of the second display area, a third sub-area apart from the first sub area, and a second sub-area between the first sub-area and the third sub-area, the plurality of connection lines in the first sub-area may have a first width, the plurality of connection lines in the second sub-area may have a second width, and the plurality of connection lines in the third sub-area may have a third width, and the third width may be greater than the second width, and the second width may be greater than the first width.

The display panel may further include a third display area on opposite (e.g., right and left) sides of the second display area, wherein the second pixel circuit is in the third display area, and the plurality of connection lines extend to the second display area from the third display area.

The plurality of connection lines may include a first connection line and a second connection line different from each other in width.

The plurality of connection lines may include a first connection line and a second connection line arranged on different layers (e.g., levels in a thickness direction) from each other, the first connection line at least partially overlapping the second connection line.

According to one or more embodiments, a display panel may include a substrate including a first display area including a plurality of first display elements, and a second display area including a plurality of second display elements, a plurality of first pixel circuits in the first display area and respectively connected to the plurality of first display elements, a plurality of second pixel circuits outside of the second display area and respectively connected to the plurality of second display elements, a first connection line and a second connection line each connecting the plurality of second display elements and the plurality of second pixel circuits to each other, a first insulating layer in the second display area, and a second insulating layer on the first insulating layer, wherein the first connection line is on the first insulating layer, the second connection line is on the second insulating layer, the first connection line and the second connection line include different materials from each other, and the first connection line and the second connection line are different from each other in width.

The first connection line may include a metal, and the second connection line may include a transparent conducting oxide.

The second display area may include a first sub area at a side of the second display area, a third sub-area apart from the first sub area, and a second sub-area between the first sub-area and the third sub-area, the first connection line in the first sub-area may have a first width, the first connection line in the second sub-area may have a second width, and the first connection line in the third sub-area may have a third width, and the third width may be greater than the second width, and the second width may be greater than the first width.

According to one or more embodiments, a display apparatus may include a display panel including a first display area including a plurality of first display elements, and a second display area including a plurality of second display elements, and a component corresponding to the second display area below the display panel, wherein the display panel further includes a substrate, a plurality of first pixel circuits in the first display area and respectively connected to the plurality of first display elements, a plurality of second pixel circuits outside of the second display area and respectively connected to the plurality of second display elements, a plurality of connection lines connecting the plurality of second display elements and the plurality of second pixel circuits to each other, a first inorganic insulating layer on the substrate, a lower-organic insulating layer arranged on the first inorganic insulating layer; and a second inorganic insulating layer on the lower-organic insulating layer in the second display area, wherein the second inorganic insulating layer has an opening exposing an upper surface of the lower-organic insulating layer.

The plurality of connection lines may include a first connection line and a second connection line arranged on different layers (e.g., levels in a thickness direction) from each other, and the first connection line and the second connection line may include different materials from each other.

The display apparatus may further include an upper-organic insulating layer on (e.g., covering) the second inorganic insulating layer, wherein a thickness of the upper-organic insulating layer in the second display area is less than a thickness of the upper-organic insulating layer in the first display area.

The display apparatus may further include an additional organic insulating layer in the second display area, wherein the lower-organic insulating layer is in the first display area, and the additional organic insulating layer is not in the first display area.

The plurality of connection lines may include a first connection line and a second connection lines different from each other in width.

The plurality of connection lines may include a first connection line and a second connection line arranged on different layers (e.g., levels in a thickness direction) from each other, the first connection line at least partially overlapping the second connection line.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
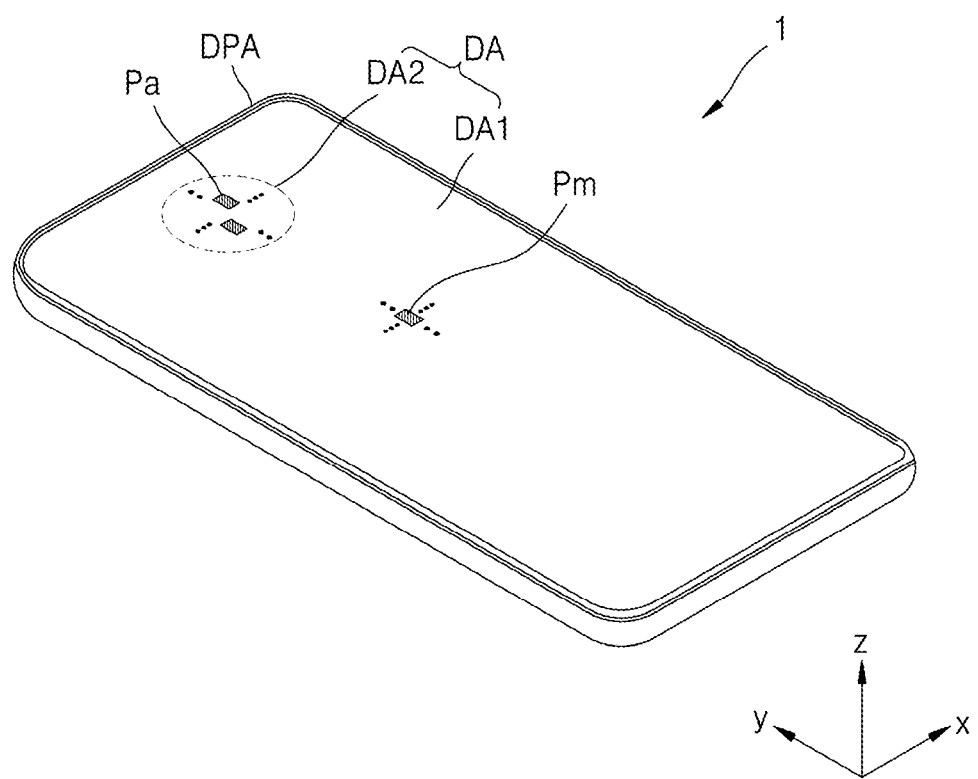
FIG. 1 is a perspective view schematically illustrating a display apparatus according to one or more embodiments.

Reference will now be made in more detail to embodiments, examples of which are illustrated in the accompanying drawings, wherein like reference numerals refer to like elements throughout the present disclosure, and duplicative descriptions thereof may not be provided. In this regard, the embodiments of the present disclosure may have different forms and should not be construed as being limited to the descriptions set forth herein. Accordingly, the embodiments are merely described below, by referring to the drawings, to explain aspects of the description of the present disclosure. As used herein, the term "and/or" includes any and all combinations of one or more of the associated listed items. As used herein, expressions such as "at least one of", "one of", and "selected from", when preceding a list of elements, modify the entire list of elements and do not modify the individual elements of the list. For example, throughout the present disclosure, the expressions "at least one of a, b and c", "at least one of a, b or c," and "at least one of a, b and/or c" may indicate only a, only b, only c, both (e.g., simultaneously) a and b, both (e.g., simultaneously) a and c, both (e.g., simultaneously) b and c, all of a, b, and c, or any variations thereof. Further, the use of "may" when describing embodiments of the present disclosure refers to "one or more embodiments of the present disclosure".

The terminology used herein is for the purpose of describing particular example embodiments only and is not intended to limit the example embodiments described herein.

It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The present disclosure may, however, be embodied in many different forms and should not be construed as being limited to the embodiments set forth herein. Effects and features of the disclosure, and methods for achieving the same will be clarified with reference to embodiments described herein in more detail with reference to the drawings. However, the embodiments of the present disclosure may be implemented in one or more suitable forms, not by being limited to the embodiments presented.

Hereinafter, embodiments will be described with reference to the accompanying drawings, wherein like reference symbols refer to like elements throughout, and duplicative descriptions thereof may not be provided the present disclosure, and redundant descriptions thereof are omitted.

It will be understood that when a component, such as a layer, a film, a region, or a plate, is referred to as being "on" another component, the component can be directly on the other component (e.g., without intervening components therebetween) or intervening components may be present thereon. In the drawings, sizes of components in the drawings may be exaggerated or reduced for convenience of explanation. For example, because sizes and thicknesses of components in the drawings are arbitrarily illustrated for convenience of description, the following embodiments are not limited thereto.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

In the following embodiments, the x-axis, the y-axis, and the z-axis are not limited to three axes of the rectangular coordinate system, and may be interpreted in a broader sense. For example, the x-axis, the y-axis, and the z-axis may be perpendicular (or substantially perpendicular) to one another, or may represent different directions that are not perpendicular (or substantially perpendicular) to one another.

FIG. 1 is a perspective view schematically illustrating a display apparatus 1 according to one or more embodiments.

Referring to FIG. 1, the display apparatus 1 may include a display area DA and a peripheral area DPA outside of the display area DA. The display area DA may include a first display area DA1 and a second display area DA2. The first display area DA1 may be arranged to at least partially surround the second display area DA2. The first display area DA1 may be a main display area, and the second display area DA2 may be a component area and/or an auxiliary display area, the component area having a component arranged therein. For example, the first display area DA1 and the second display area DA2 may display an image individually or together (e.g., simultaneously or concurrently). The peripheral area DPA may be a non-display area in which display elements are not arranged. The display area DA may be entirely surrounded by the peripheral area DPA.

In FIG. 1, a single second display area DA2, in which a component is arranged, is positioned in the first display area DA1. In one or more other embodiments, the display apparatus 1 may include two or more second display areas DA2, and shapes and sizes of the second display areas DA2 may be different from each other. When viewed from a direction approximately perpendicular (e.g., normal) to an upper surface of the display apparatus 1, the second display area DA2 may have one or more suitable shapes, such as a circular shape, an elliptical shape, a polygonal shape such as a quadrangle, a star shape, and/or a diamond shape. In some embodiments, for example as shown in FIG. 1, the second display area DA2 is arranged at an upper center portion of the first display area DA1 (in +y direction) having an approximately circular and/or quadrangular shape when viewed from the direction approximately perpendicular (e.g., normal) to the upper surface of the display apparatus 1 (e.g., in a plan view). However, the second display area DA2 may also be arranged at one side, for example, at an upper right side or an upper left side, of the first display area DA1 having a circular and/or quadrangular shape.

The display apparatus 1 may provide an image by utilizing a plurality of pixels. The pixel may include sub-pixels capable of displaying red, green, and/or blue colors. The pixel may include a set of a plurality of sub-pixels.

The sub-pixel may be implemented as (e.g., may include) an emission area of a single display element. The display element may include a pixel electrode (an anode), an opposite electrode (a cathode), and an emission layer arranged between the pixel electrode and the opposite electrode, and the emission area may be defined as an area in which the emission layer emits (e.g., is configured to emit) light. In one or more embodiments, the emission area may be defined as an opening area of a pixel-defining layer covering an edge of the pixel electrode and exposing a central portion of the pixel electrode. Similarly, the sub-pixel may be defined as the opening area of the pixel-defining layer.

The emission layer may include an organic material capable of substantially displaying red, green, and/or blue colors. The emission layer may include an emission area in which light is emitted (e.g., is configured to be emitted) and a non-emission area in which light is not emitted according to an overlapping area of a first electrode (anode) and a second electrode (cathode).

In the present disclosure, the pixel may be utilized in substantially the same manner (e.g., for substantially the same purpose) as a sub-pixel. For example, the pixel may be implemented as (e.g., may include) an emission area of a single display element. In some embodiments, the pixel or the sub-pixel may be utilized in substantially the same manner (e.g., for substantially the same purpose) as the display element.

The display apparatus 1 may provide an image by utilizing a plurality of first pixels Pm arranged in the first display area DA1 and a plurality of second pixels Pa arranged in the second display area DA2.

The plurality of second pixels Pa may be arranged in the second display area DA2. The plurality of second pixels Pa may be to emit (e.g., may be configured to emit) light to provide an image. An image displayed in the second display area DA2 may include an auxiliary image and may have a resolution less than that of an image displayed in the first display area DA1.

A component 40 (see FIG. 2) as an electronic element may be arranged below a display panel in the second display area DA2. The component 40 includes a camera using infrared or visible light, and may include an imaging device. In some embodiments, the component 40 may include a solar cell, a flash, an illuminance sensor, a proximity sensor, or an iris sensor. In some embodiments, the component 40 may have a function to receive sound (e.g., may be able to receive sound). To minimize or reduce limitations on the functions of the component 40, a second pixel circuit for driving the second pixels Pa arranged in the second display area DA2 may be arranged in a third area AR3, and not in the second display area DA2. In one or more embodiments, the third area AR3 may be the peripheral area DPA. In one or more other embodiments, the third area AR3 may be a display area that is arranged between the first display area DA1 and the second display area DA2 to provide (e.g., display) an image.

In a display panel and a display apparatus including the display panel according to one or more embodiments, when light transmits through the second display area DA2, a light transmittance may be about 10% or more, for example, about 40% or more, about 25% or more, about 50% or more, about 85% or more, or about 90% or more.

Figure 2:
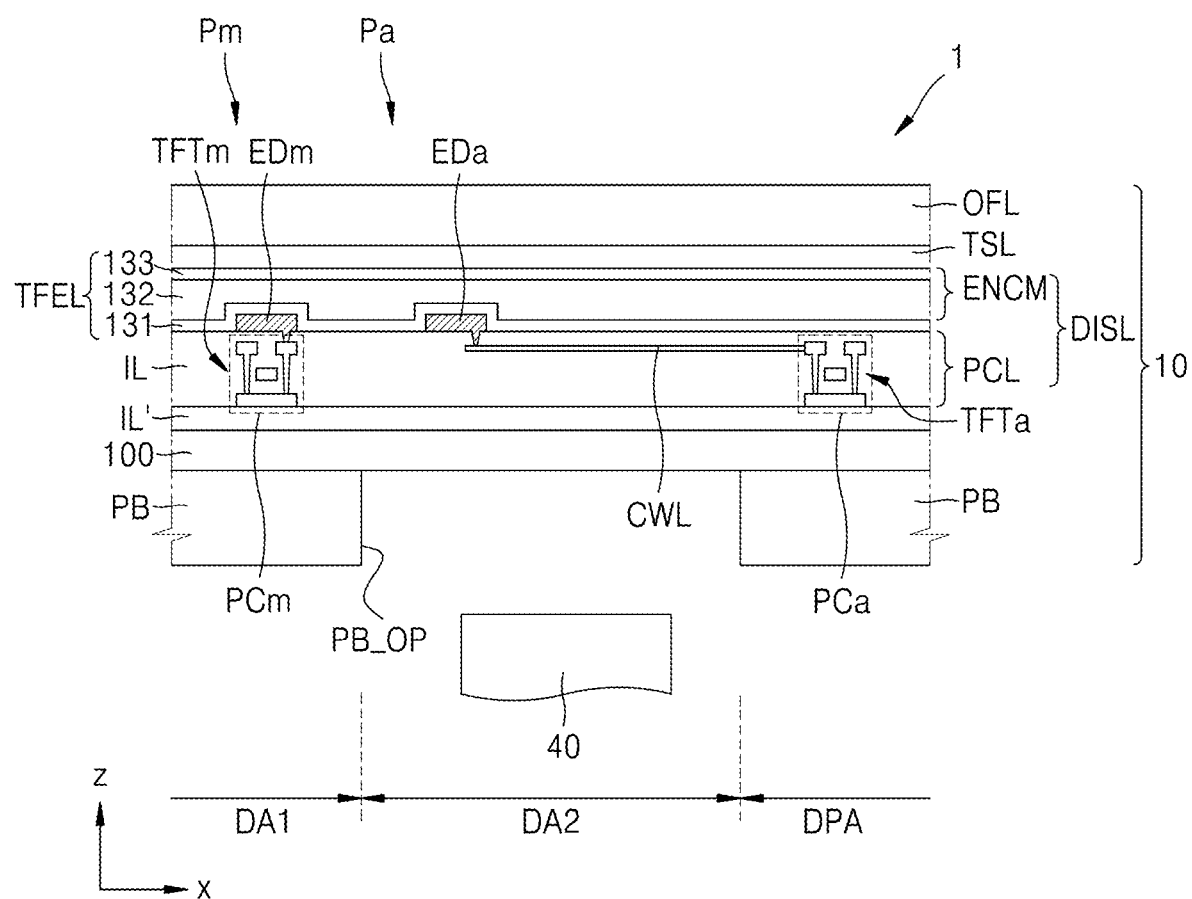
FIG. 2 is a cross-sectional view schematically illustrating a portion of a display apparatus, according to one or more embodiments.

FIG. 2 is a cross-sectional view schematically illustrating a portion of a display apparatus 1 according to one or more embodiments.

Referring to FIG. 2, the display apparatus 1 may include a display panel 10 and the component 40 overlapping the display panel 10. A cover window for protecting the display panel 10 may be further arranged on the display panel 10.

The display panel 10 may include the second display area DA2, which is an area overlapping the component 40, and the first display area DA1, in which a main image is displayed. The display panel 10 may include a substrate 100, a display layer DISL on the substrate 100, a touch screen layer TSL, an optical functional layer OFL, and a panel protection member PB below the substrate 100.

The display layer DISL may include a circuit layer PCL, a display element layer, and an encapsulation member ENCM such as a thin-film encapsulation layer TFEL or an encapsulation substrate. The circuit layer PCL may include thin-film transistors TFTm and TFTa, and the display element layer may include first and second light-emitting elements EDm and EDa as display elements. Insulating layers IL and IL' may be arranged between the substrate 100 and the display layer DISL and may be in the display layer DISL.

The substrate 100 may include an insulating material, such as glass, quartz, and/or polymer resin. The substrate 100 may include a rigid substrate or a flexible substrate that is bendable, foldable, and/or rollable.

A first pixel circuit PCm and a first display element EDm connected (e.g., electrically coupled) thereto may be arranged in the first display area DA1 of the display panel 10. The first pixel circuit PCm may include at least one thin-film transistor TFTm and may control emission of the first display element EDm. The first pixel Pm may be implemented by emission by (from) the first display element EDm.

A second display element EDa may be arranged in the second display area DA2 of the display panel 10 to implement the second pixel Pa. The second display area DA2 is an auxiliary display area, and a resolution of the second display area DA2 may be less than that of the first display area DA1. For example, the number of second display elements EDa arranged in the second display area DA2 per unit area may be less than the number of first display elements EDm arranged in the first display area DA1 per unit area.

In the present embodiments, a second pixel circuit PCa for driving (e.g., to drive) the second display element EDa may be arranged outside of the second display element EDa, and may not be in the second display area DA2. In one or more embodiments, the second pixel circuit PCa may not be arranged in the second display area DA2, but may be arranged in the peripheral area DPA. In one or more other embodiments, the second pixel circuit PCa may be arranged in a third display area between the first display area DA1 and the second display area DA2, and one or more suitable modifications may be made. For example, the second pixel circuit PCa may be arranged not to overlap the second display element EDa.

The second pixel circuit PCa may include at least one thin-film transistor TFTa, and may be electrically connected (e.g., electrically coupled) to the second display element EDa by utilizing a connection line CWL. The second pixel circuit PCa may control emission by the second display element EDa. The second pixel Pa may be implemented by emission by (from) the second display element EDa.

In some embodiments, the second display area DA2 may include a transmission area through which light/sound emitted from or incident on the component 40 may transmit. The transmission area of the second display area DA2 may include a remaining area of the second display area DA2 in which a pixel electrode (anode) of the second display area DA2 is not arranged. The transmission area may include an area other than an area in which the second display element EDa emits (e.g., is configured to emit) light. The transmission area may include an area between the second pixels Pa. The transmission area may include an area between the second display elements EDa.

An inorganic insulating layer such as a buffer layer and/or a gate insulating layer that may be included in the insulating layers IL and IL' may be arranged in the transmission area. The transmission area may include an organic insulating layer that may be included in the insulating layers IL and IL'. An opposite electrode (cathode) may be arranged in the transmission area. An inorganic encapsulation layer and/or an organic encapsulation layer of the thin-film encapsulation layer TFEL may be arranged in the transmission area. A line including a metal and/or a transparent conductive material may be arranged in the transmission area. The substrate 100, a polarizer, an adhesive, a window, and a panel protection member PB may be arranged in the transmission area.

Because the second pixel circuit is not disposed in the second display area DA2, the number of second display elements EDa arranged in the second display area DA2 per unit of area is less than the number of first display elements EDm arranged in the first display area DA1 per unit of area, a light transmittance of the second display area DA2 may be high (or suitable).

The first display element EDm and the second display element EDa as display elements may be covered with the thin-film encapsulation layer TFEL and/or the encapsulation substrate. In some embodiments, the thin-film encapsulation layer TFEL may include at least one inorganic encapsulation layer and at least one organic encapsulation layer as illustrated in FIG. 2. In one or more embodiments, the thin-film encapsulation layer TFEL may include first and second inorganic encapsulation layers 131 and 133 and an organic encapsulation layer 132 therebetween.

The first inorganic encapsulation layer 131 and the second inorganic encapsulation layer 133 may each independently include one or more inorganic insulating materials such as silicon oxide ($SiO_2$), silicon nitride ($SiN_x$), silicon oxynitride ($SiO_xN_y$), aluminum oxide ($Al_2O_3$), titanium oxide ($TiO_2$), tantalum oxide ($Ta_2O_5$), and/or hafnium oxide ($HfO_2$), and may be formed by chemical vapor deposition (CVD) and/or the like. The organic encapsulation layer 132 may include a polymer-based material. The polymer-based material may include silicon-based resin, acryl-based resin, epoxy-based resin, polyimide, polyethylene, and/or the like.

The first inorganic encapsulation layer 131, the organic encapsulation layer 132, and the second inorganic encapsulation layer 133 may be integrally formed as a single body to cover the first display area DA1 and the second display area DA2.

When the first display element EDm and the second display element EDa as display elements are sealed with the encapsulation substrate, the encapsulation substrate may be arranged to face the substrate 100 with the display elements therebetween. The encapsulation substrate and the display element may have a gap therebetween. The encapsulation substrate may include glass. A sealant including frit, etc. may be arranged between the substrate 100 and the encapsulation substrate, and the sealant may be arranged in the peripheral area DPA. The sealant arranged in the peripheral area DPA may prevent or reduce penetration of water through a side surface of the display area DA while around (e.g., surrounding) the display area DA.

The touch screen layer TSL may obtain coordinate information based on an external input, for example, a touch event. The touch screen layer TSL may include a touch electrode and touch lines connected to the touch electrode. The touch screen layer TSL may detect an external input based on a magnetic capacitance method and/or a mutual capacitance method.

The touch screen layer TSL may be provided on the thin-film encapsulation layer TFEL. In some embodiments, the touch screen layer TSL may be separately formed on a touch substrate and then may be coupled onto the thin-film encapsulation layer TFEL by utilizing an adhesive layer such as an optical clear adhesive (OCA). In one or more embodiments, the touch screen layer TSL may be directly provided on the thin-film encapsulation layer TFEL, in which case an adhesive layer may not be between the touch screen layer TSL and the thin-film encapsulation layer TFEL.

The optical functional layer OFL may include an anti-reflection layer. The anti-reflection layer may reduce a reflectance of light (e.g., external light) incident toward the display apparatus 1 from the outside. In some embodiments, the optical functional layer OFL may include a polarizing film. In some embodiments, the optical functional layer OFL may be provided as a filter plate including a black matrix and color filters.

The panel protection member PB may be attached to a lower surface of the substrate 100 to support and protect the substrate 100. The panel protection member PB may have an opening PB_OP corresponding to the second display area DA2. By providing the opening PB_OP in the panel protection member PB, the light transmittance of the second display area DA2 may be improved. The panel protection member PB may include polyethylene terephthalate (PET) and/or polyimide (PI).

An area of the opening PB_OP provided in the panel protection member PB may not correspond to (e.g., may be smaller than) the area of the second display area DA2. However, the present disclosure is not limited thereto. For example, the panel protection member PB may not have the opening PB_OP, and may be continuously arranged to correspond to the second display area DA2.

In some embodiments, a plurality of components 40 may be arranged in the second display area DA2. The plurality of components 40 may have different functions from one another. For example, the plurality of components 40 may include at least two of a camera (an imaging device), a solar cell, a flash, a proximity sensor, an illuminance sensor, or an iris sensor.

Figure 3:
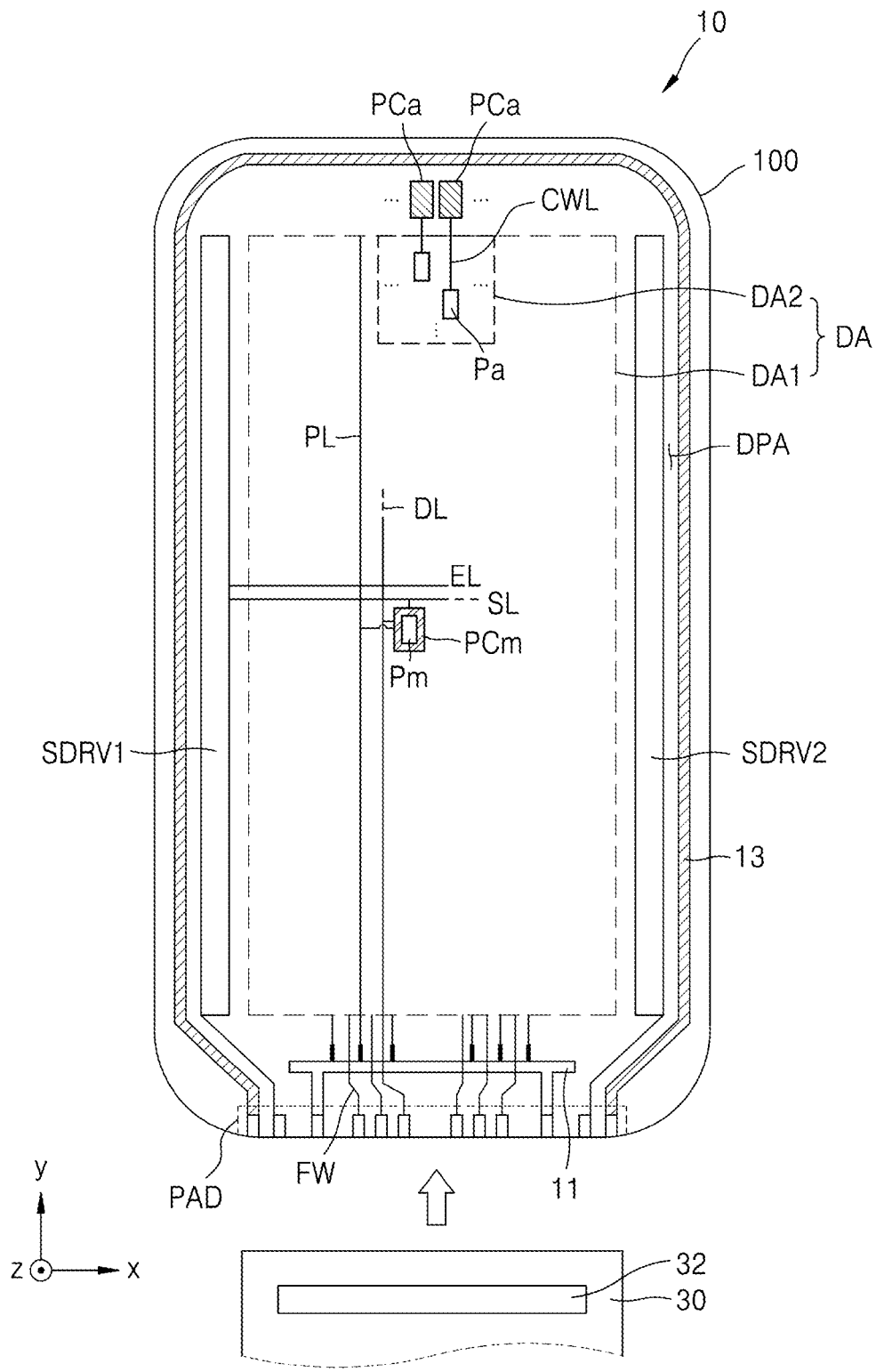
FIG. 3 is a plan view schematically illustrating a display panel that may be included in the display apparatus of FIG. 1, according to one or more embodiments.

FIG. 3 is a plan view schematically illustrating a display panel 10 that may be included in the display apparatus 1 in FIG. 1, according to one or more embodiments.

Referring to FIG. 3, one or more suitable elements included in the display panel 10 may be arranged on a substrate 100. The substrate 100 may include a display area DA and a peripheral area DPA around (e.g., surrounding) the display area DA. The display area DA may include a first display area DA1 in which a main image is displayed, and a second display area DA2 in which an auxiliary image is displayed. The auxiliary image may constitute one full (e.g., integral) image along with the main image, or may be an image independent from the main image.

A plurality of first pixels Pm may be arranged in the first display area DA1. Each of the first pixels Pm may be implemented as (e.g., may include) a display element such as an organic light-emitting diode. A first pixel circuit PCm for driving the first pixel Pm may be arranged in the first display area DA1, and may be arranged to overlap the first pixel Pm. Each of the first pixels Pm may be to emit (e.g., may be configured to emit), for example, red, green, blue, and/or white light. The first display area DA1 may be covered with an encapsulation member and protected from ambient air, moisture, and/or the like.

As described above, the second display area DA2 may be at one side of the first display area DA1, or may be arranged in the display area DA and surrounded by the first display area DA1. A plurality of second pixels Pa may be arranged in the second display area DA2. Each of the plurality of second pixels Pa may be implemented as (e.g., may include) a display element such as an organic light-emitting diode. A second pixel circuit PCa for driving the second pixel Pa may be arranged in the peripheral area DPA close to the second display area DA2. For example, when the second display area DA2 is arranged at an upper side of the display area DA, the second pixel circuit PCa may be arranged at an upper side of the peripheral area DPA. The second pixel circuit PCa and a display element implementing (e.g., included in) the second pixel Pa may be connected (e.g., electrically coupled) to each other by utilizing a connection line CWL extending in a y direction. Each of the second pixels Pa may be to emit (e.g., may be configured to emit), for example, red, green, blue, and/or white light. The second display area DA2 may be covered with an encapsulation member and protected from ambient air, moisture, and/or the like.

A resolution of the second display area DA2 may be about ½, ⅜, ⅓, ¼, 2/9, ⅛, 1/9, 1/16, etc. of a resolution of the first display area DA1. For example, the resolution of the first display area DA1 may be about 400 ppi or more, and the resolution of the second display area DA2 may be about 200 ppi or about 100 ppi.

Each of pixel circuits for driving the first and second pixels Pm and Pa may be electrically connected to outer circuits arranged in the peripheral area DPA. A first scan driving circuit SDRV1, a second scan driving circuit SDRV2, a terminal unit PAD, a driving voltage supply line 11, and a common voltage supply line 13 may be arranged in the peripheral area DPA.

The first scan driving circuit SDRV1 may be to transmit (e.g., may be configured to transmit), via a main scan line SL, a scan signal to each of the first pixel circuits PCm for driving the first pixels Pm. The first scan driving circuit SDRV1 may be to transmit (e.g., may be configured to transmit) an emission control signal to each of the first pixel circuits PCm via a main emission control line EL. The second scan driving circuit SDRV2 may be positioned on an opposite side of the first scan driving circuit SDRV1 with respect to the first display area DA1, and may be approximately parallel (e.g., substantially parallel) to the first scan driving circuit SDRV1. Some of pixel circuits of the first pixels Pm in the first display area DA1 may be electrically connected to the first scan driving circuit SDRV1, and remaining pixel circuits may be electrically connected to the second scan driving circuit SDRV2.

The terminal unit PAD may be arranged at one side of the substrate 100. The terminal unit PAD may be exposed, rather than being covered with an insulating layer, to be connected (e.g., electrically coupled) to a display circuit board 30. A display driving unit 32 may be arranged in the display circuit board 30.

The display driving unit 32 may generate a control signal to be transmitted to the first scan driving circuit SDRV1 and the second scan driving circuit SDRV2. The display driving unit 32 may generate a data signal, and the generated data signal may be transmitted to the first pixel circuits PCm via a fan-out line FW and a main data line DL connected to the fan-out line FW.

The display driving unit 32 may apply a driving voltage to the driving voltage supply line 11, and may apply a common voltage to the common voltage supply line 13. The driving voltage may be applied to the pixel circuits of the first and second pixels Pm and Pa through a driving voltage line PL connected to the driving voltage supply line 11, and the common voltage may be connected to the common voltage supply line 13 to be applied to an opposite electrode of a display element.

The driving voltage supply line 11 may extend in an x direction below the first display area DA1. The common voltage supply line 13 may have a loop shape of which one side is opened, to partially surround the first display area DA1.

In FIG. 3, one second display area DA2 is shown, but a plurality of second display areas DA2 may be provided. In this case, the plurality of second display areas DA2 may be apart (e.g., spaced apart) from each other, and a first camera may be arranged to correspond to one second display area DA2, and a second camera may be arranged to correspond to another second display area DA2. In some embodiments, a camera may be arranged to correspond to one second display area DA2, and an infrared sensor may be arranged to correspond to another second display area DA2. The plurality of second display areas DA2 may have different shapes and/or different sizes.

In some embodiments, the second display area DA2 may be provided in a circular shape, an elliptical shape, a polygonal shape, and/or an irregular shape. In some embodiments, the second display area DA2 may be provided in an octagonal shape. The second display area DA2 may be provided in any suitable polygonal shape such as a quadrangular shape and/or a hexagonal shape. The second display area DA2 may be around (e.g., may be surrounded by) the first display area DA1.

Figure 4:
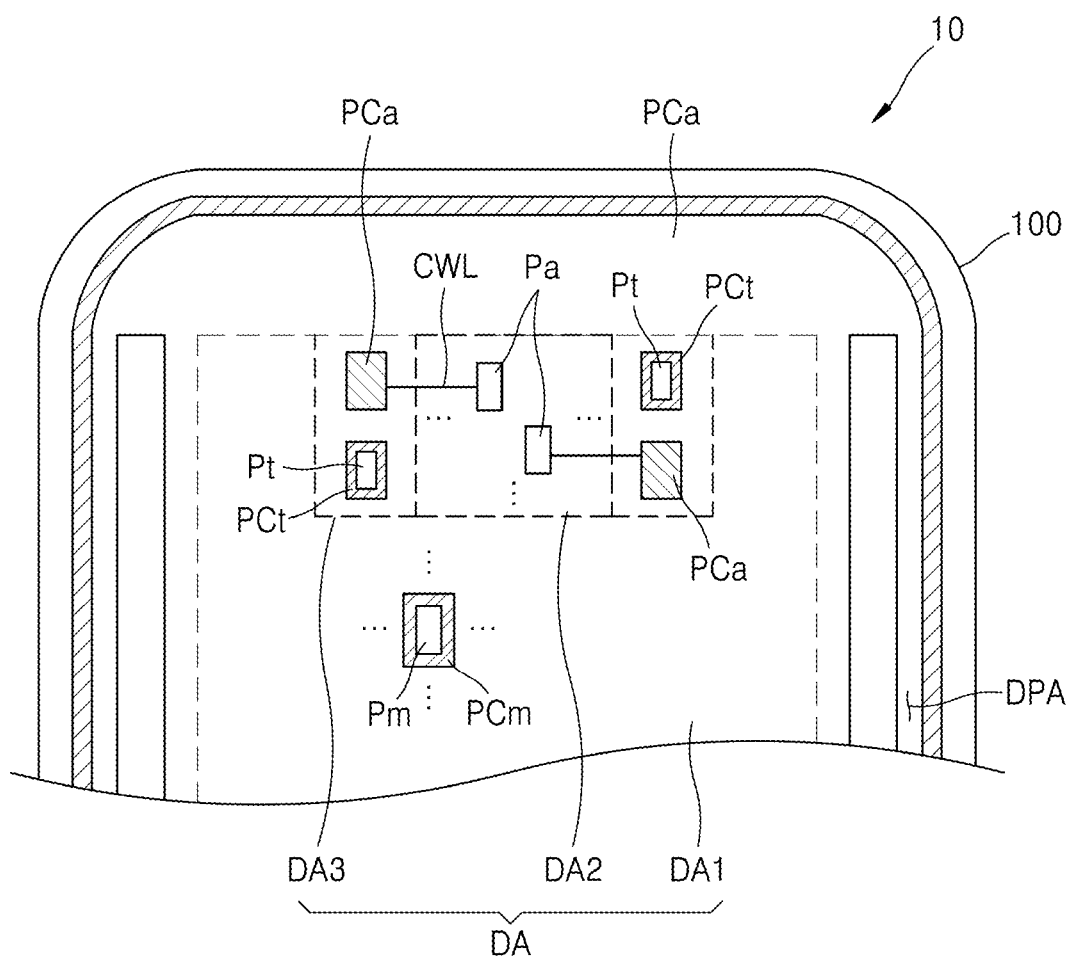
FIG. 4 is a plan view schematically illustrating a display panel that may be included in the display apparatus of FIG. 1, according to one or more embodiments.
Figure 5:
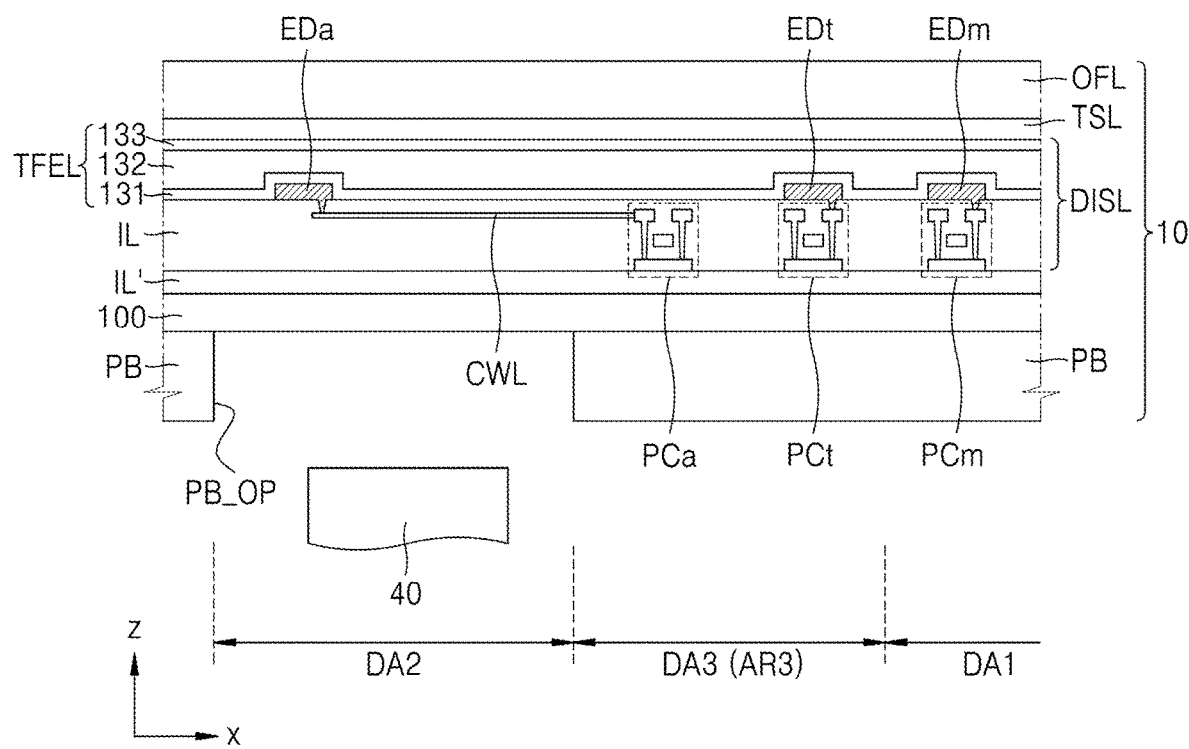
FIG. 5 is a schematic cross-sectional view of the display panel of FIG. 4.

FIG. 4 is a plan view schematically illustrating a display panel 10 that may be included in the display apparatus 1 in FIG. 1, according to one or more embodiments. FIG. 5 is a schematic cross-sectional view of the display panel 10 in FIG. 4. In FIGS. 4 and 5, the same reference symbols as those of FIGS. 2 and 3 denote the same elements, and duplicative descriptions thereof are not provided.

Referring to FIGS. 4 and 5, a display area DA of a substrate 100 may include the first display area DA1, the second display area DA2, and a third display area DA3 between the first display area DA1 and the second display area DA2.

The first display area DA1 may include an area in which a main image is displayed. The second display area DA2 and the third display area DA3 may include an area in which an auxiliary image is displayed. The auxiliary image may constitute one full (e.g., integral) image along with the main image, or may be an image independent from the main image.

The third display area DA3 may be arranged at (e.g., on) at least one side of the second display area DA2. In FIG. 4, the third display area DA3 is arranged on left and right sides of the second display area DA2, but the present disclosure is not limited thereto. The third display area DA3 may be arranged above or below the second display area DA2, or may be arranged to surround the second display area DA2, and one or more suitable modifications may be made.

A plurality of third pixels Pt may be arranged in the third display area DA3. Each of the third pixels Pt may be implemented as (e.g., may include) a display element such as an organic light-emitting diode. A third pixel circuit PCt for driving the third pixel Pt (including a third display element EDt) may be arranged in the third display area DA3, and may be arranged to overlap the third pixel Pt. Each of the third pixels Pt may be to emit (e.g., may be configured to emit), for example, red, green, blue, and/or white light. The third display area DA3 may be covered with an encapsulation member and protected from ambient air, moisture, and/or the like.

A second pixel circuit PCa for driving a second pixel Pa of the second display area DA2 may be arranged in the third display area DA3. For example, the third display area DA3 may function as the third area AR3 described above. The second pixel circuit PCa and the third pixel Pt may be alternately arranged in the third display area DA3. The second pixel circuit PCa and the second display element EDa may be connected to each other by utilizing a connection line CWL extending in an x direction, the second display element EDa implementing (e.g., being included in) the second pixel Pa.

A resolution of the third display area DA3 may be the same as a resolution of the second display area DA2. In some embodiments, the resolution of the third display area DA3 may be greater than the resolution of the second display area DA2 and may be less than a resolution of the first display area DA1.

For example, the resolution of the third display area DA3 may be about ½, ⅜, ⅓, ¼, ⅔, ⅛, ⅙, 1/16, etc. of the resolution of the first display area DA1. For example, the resolution of the first display area DA1 may be about 400 ppi or more, and the resolution of each of the second display area DA2 and the third display area DA3 may be about 200 ppi or about 100 ppi.

In one or more embodiments, a first pixel circuit PCm, the second pixel circuit PCa, and the third pixel circuit PCt may be substantially the same. However, the present disclosure is not limited thereto. The first pixel circuit PCm, the second pixel circuit PCa, and the third pixel circuit PCt may be different, and one or more suitable modifications may be made.

Figure 6:
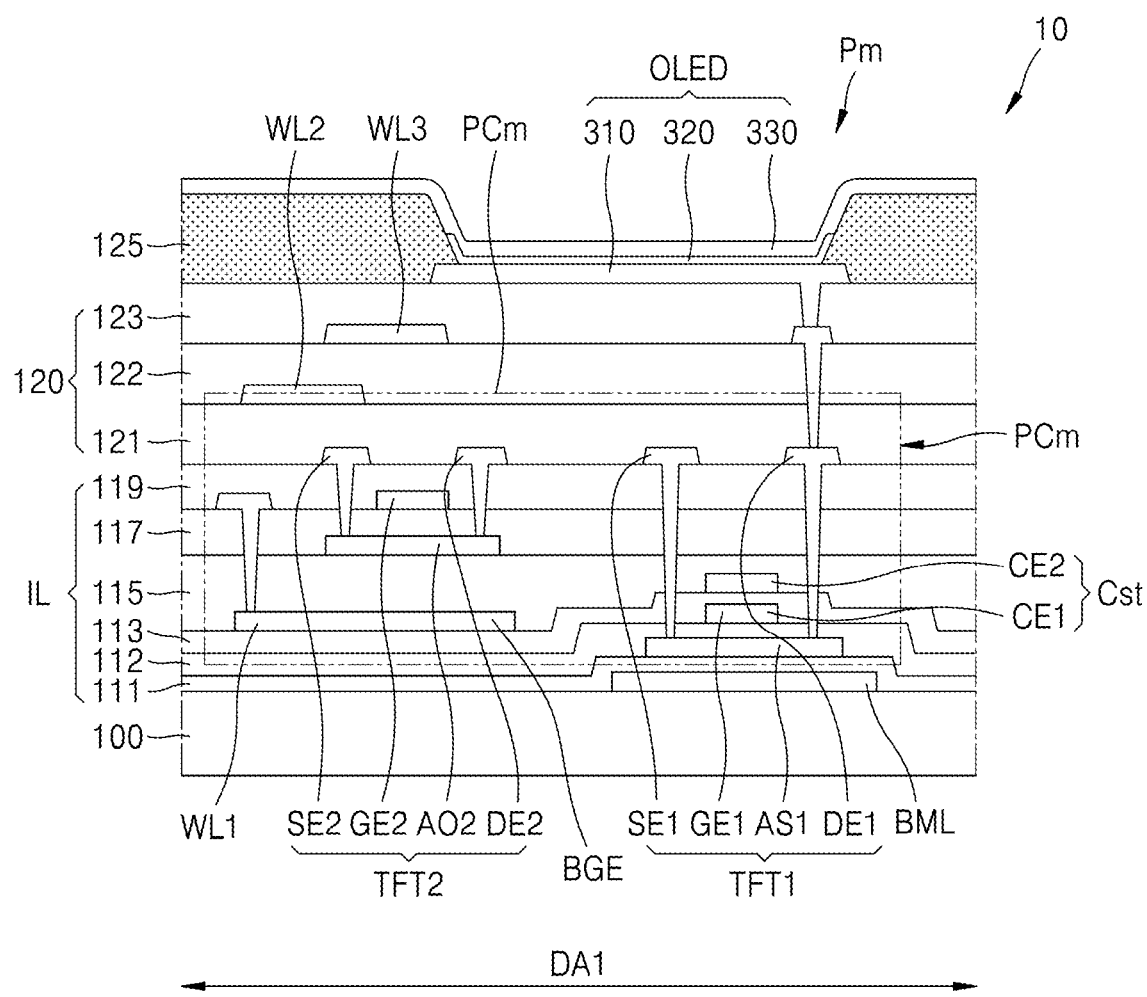
FIG. 6 is a schematic cross-sectional view illustrating a portion of a display panel according to one or more embodiments.

FIG. 6 is a schematic cross-sectional view illustrating a portion of the display panel 10 and a portion of the first display area DA1 according to one or more embodiments.

Referring to FIG. 6, a first pixel circuit PCm may be arranged on a substrate 100 in the first display area DA1 of the display panel 10, and an organic light-emitting diode OLED may be arranged as a first display element connected to the first pixel circuit PCm. In some embodiments, a lower conductive layer BML may be further arranged between the substrate 100 and the first pixel circuit PCm.

The first pixel circuit PCm according to the present embodiments may include a first thin-film transistor TFT1 including a silicon semiconductor, and a second thin-film transistor TFT2 including an oxide semiconductor. The first pixel circuit PCm may further include a storage capacitor Cst.

The first thin-film transistor TFT1 may include a first semiconductor layer AS1 including a silicon semiconductor and a first gate electrode GE1 insulated from the first semiconductor layer AS1. The first thin-film transistor TFT1 may include a first source electrode SE1 and a first drain electrode DE1, and the first source electrode SE1 and/or the first drain electrode DE1 may be connected to the first semiconductor layer AS1. The first thin-film transistor TFT1 may function as a driving thin-film transistor.

The second thin-film transistor TFT2 may include a second semiconductor layer AO2 including an oxide semiconductor, and a second gate electrode GE2 insulated from the second semiconductor layer AO2. The second thin-film transistor TFT2 may include a second source electrode SE2 and a second drain electrode DE2, and the second source electrode SE2 and/or the second drain electrode DE2 may be connected to the second semiconductor layer AO2. The second thin-film transistor TFT2 may function as a switching thin-film transistor. In some embodiments, the second thin-film transistor TFT2 may be any suitable thin-film transistor other than a driving thin-film transistor.

In one or more embodiments, the first semiconductor layer AS1 of the first thin-film transistor TFT1 functioning as the driving thin-film transistor may include polycrystalline silicon having excellent or suitable reliability, and the second semiconductor layer AO2 of the second thin-film transistor TFT2 corresponding to the switching thin-film transistor may include an oxide semiconductor having low leakage current.

For example, the driving thin-film transistor, which directly affects a brightness of a display element, may include a semiconductor layer including polycrystalline silicon having high reliability, and thus, a high-resolution display apparatus may be implemented.

A thin-film transistor including an oxide semiconductor has high carrier mobility and low leakage current, and thus, a voltage drop of the thin-film transistor is not large even when a driving time is long. Accordingly, in the thin-film transistor including the oxide semiconductor, even during low-frequency driving, a color change of an image according to the voltage drop is not large, and thus, low-frequency driving is possible. Thus, when a driving circuit includes the thin-film transistor including the semiconductor layer including the oxide semiconductor, power consumption may be lower than when all of the thin-film transistors included in the driving circuit include a semiconductor layer including polycrystalline silicon.

In the present embodiments, at least one of remaining thin-film transistors excluding the driving thin-film transistor includes an active layer including an oxide semiconductor, and thus, power consumption of the display apparatus may be reduced.

In some embodiments, the lower conductive layer BML overlapping the first thin-film transistor TFT1 may be arranged below the first thin-film transistor TFT1, according to one or more embodiments. A constant voltage may be applied to the lower conductive layer BML. Because the lower conductive layer BML is arranged below the first thin-film transistor TFT1, the first thin-film transistor TFT1 is less affected by surrounding interference signals, and thus, the reliability of the display apparatus may be further improved.

In some embodiments, an organic light-emitting diode is utilized as a display element. However, in other embodiments, an inorganic light-emitting element or a quantum dot light-emitting element may be utilized as the display element.

Hereinafter, a stacked structure of the elements included in the display panel 10 are described.

The substrate 100 may include an insulating material such as glass, quartz, and/or polymer resin. The substrate 100 may include a rigid substrate or a flexible substrate that is bendable, foldable, and/or rollable. The substrate 100 may have a single-layer or a multi-layer structure of the above material(s), and when the substrate 100 has a multi-layer structure, the substrate 100 may further include an inorganic layer. In some embodiments, the substrate 100 may have a structure of an organic material/inorganic material/organic material.

A buffer layer 111 may be on the substrate 100 to reduce or block penetration of foreign materials, moisture, and/or ambient air from below the substrate 100, and may provide a suitably flat surface on the substrate 100. The buffer layer 111 may include an inorganic material, such as an oxide and/or a nitride, an organic material, or an organic and inorganic compound, and may have a single-layer or a multi-layer structure of an inorganic material and an organic material. In some embodiments, the buffer layer 111 may include silicon oxide ($SiO_2$) and/or silicon nitride ($SiN_x$).

The lower conductive layer BML may be arranged between the substrate 100 and the buffer layer 111. The lower conductive layer BML may include a conductive material. In some embodiments, the lower conductive layer BML may include a transparent conductive material. For example, the lower conductive layer BML may include a conductive oxide such as indium tin oxide (ITO), indium zinc oxide (IZO), zinc oxide (ZnO), indium oxide ($In_2O_3$), indium gallium oxide (IGO), and/or aluminum zinc oxide (AZO). The lower conductive layer BML may be arranged to overlap the first thin-film transistor TFT1, and a constant voltage may be applied to the lower conductive layer BML. A barrier layer for blocking or reducing penetration of ambient air may be further included between the substrate 100 and the lower conductive layer BML. The barrier layer may include an inorganic material such as an oxide and/or a nitride, an organic material, or an organic/inorganic compound, and may include a single-layer or a multi-layer structure of an inorganic material and an organic material.

The first semiconductor layer AS1 including a silicon semiconductor may be arranged on the buffer layer 111, and the first semiconductor layer AS1 may include polysilicon and/or amorphous silicon. The first semiconductor layer AS1 may include a channel area, a source area, and a drain area, the source area and the drain area being doped with impurities.

A first gate insulating layer 112 may be provided to cover the first semiconductor layer AS1. The first gate insulating layer 112 may include an inorganic insulating material such as $SiO_2$, $SiN_x$, silicon oxynitride ($SiO_xN_y$), $Al_2O_3$, and/or $TiO_2$. The first gate insulating layer 112 may be a single layer or a plurality of layers including the inorganic insulating material described above.

The first gate electrode GE1 may be arranged on the first gate insulating layer 112 to overlap the first semiconductor layer AS1. The first gate electrode GE1 may include molybdenum (Mo), aluminum (Al), copper (Cu), titanium (Ti), and/or the like, and may include a single layer or a plurality of layers. For example, the first gate electrode GE1 may be a single Mo layer.

A second gate insulating layer 113 may be provided to cover the first gate electrode GE1. The second gate insulating layer 113 may include an inorganic insulating material such as $SiO_2$, $SiN_x$, $SiO_xN_y$, $Al_2O_3$, and/or $TiO_2$. The second gate insulating layer 113 may be a single layer or a plurality of layers including the inorganic insulating material(s) described above.

The storage capacitor Cst may be provided on the first gate electrode GE1 to overlap the first gate electrode GE1. The storage capacitor Cst may include a lower electrode CE1 and an upper electrode CE2. The second gate insulating layer 113 may be arranged between the lower electrode CE1 and the upper electrode CE2. In this case, the first gate electrode GE1 may perform a function not only as a gate electrode of the first thin-film transistor TFT1 but also as the lower electrode CE1 of the storage capacitor Cst. For example, the first gate electrode GE1 and the lower electrode CE1 may be integrally provided as a single body. The upper electrode CE2 may be arranged on the second gate insulating layer 113 to at least partially overlap the lower electrode CE1.

A first line WL1 and a lower gate electrode BGE may be arranged on the second gate insulating layer 113. The first line WL1 may be to transmit (e.g., may be configured to transmit) a signal to be transmitted to the first thin-film transistor TFT1 or the second thin-film transistor TFT2. The lower gate electrode BGE may overlap the second semiconductor layer AO2 of the second thin-film transistor TFT2 and apply a gate signal to the second thin-film transistor TFT2. In this case, the second thin-film transistor TFT2 may have a double-gate electrode structure in which a gate electrode is arranged above and below the second semiconductor layer AO2.

The lower gate electrode BGE may be provided as a portion of the first line WL1. In this case, the first line WL1 may be to transmit (e.g., may be configured to transmit) a gate signal to the second thin-film transistor TFT2.

The second gate insulating layer 113 may include an inorganic material including an oxide and/or a nitride. For example, the second gate insulating layer 113 may include $SiO_2$, $SiN_x$, SiON, $Al_2O_3$, $TiO_2$, etc.

A first interlayer insulating layer 115 may be provided on (e.g., to cover) the upper electrode CE2, the first line WL1, and the lower gate electrode BGE. The first interlayer insulating layer 115 may include $SiO_2$, $SiN_x$, $SiO_xN_y$, $Al_2O_3$, $TiO_2$, etc. The first interlayer insulating layer 115 may include a single layer or a plurality of layers including the inorganic insulating materials described above.

The second semiconductor layer AO2 including an oxide semiconductor may be arranged on the first interlayer insulating layer 115. The second semiconductor layer AO2 may include a channel area, a source area, and a drain area, the source area and the drain area being at opposite sides of the channel area. The second semiconductor layer AO2 may include an oxide of at least one of indium (In), gallium (Ga), tin (Sn), zirconium (Zr), hafnium (Hf), titanium (Ti), or zinc (Zn). In some embodiments, the second semiconductor layer AO2 may include an In—Ga—Zn—O (IGZO) semiconductor in which a metal such as In and/or Ga is contained in ZnO.

The source area and drain area of the second semiconductor layer AO2 may be provided by adjusting a carrier concentration of an oxide semiconductor to allow the oxide semiconductor to be conductive. For example, the source area and drain area of the second semiconductor layer AO2 may be provided by increasing the carrier concentration of the oxide semiconductor by a plasma treatment utilizing hydrogen (H)-based gas, fluorine (F)-based gas, or any combinations thereof.

The second gate electrode GE2 may be arranged above the second semiconductor layer AO2, and a second interlayer insulating layer 117 may be arranged between the second semiconductor layer AO2 and the second gate electrode GE2. The second gate electrode GE2 may be arranged to overlap the second semiconductor layer AO2, and may be insulated from the second semiconductor layer AO2 by the second interlayer insulating layer 117.

The second interlayer insulating layer 117 may include $SiO_2$, $SiN_x$, $SiO_xN_y$, $Al_2O_3$, $TiO_2$, $Ta_2O_5$, and/or $HfO_2$. The second interlayer insulating layer 117 may include a single layer or a plurality of layers including the inorganic insulating material(s) described above.

A third interlayer insulating layer 119 may be arranged on the second gate electrode GE2, and the first source electrode SE1 and/or the first drain electrode DE1, which are connected to the first semiconductor layer AS1, and the second source electrode SE2 and/or the second drain electrode DE2, which are connected to the second semiconductor layer AO2, may be arranged on the third interlayer insulating layer 119. In some embodiments, a data line configured to transmit a data signal, and a driving voltage line configured to transmit a driving voltage, may be arranged on the third interlayer insulating layer 119. The first source electrode SE1, the first drain electrode DE1, the second source electrode SE2, and/or the second drain electrode DE2 may be connected to the data line and/or the driving voltage line directly or via another thin-film transistor.

The third interlayer insulating layer 119 may include $SiO_2$, $SiN_x$, $SiO_xN_y$, $Al_2O_3$, $TiO_2$, $Ta_2O_5$, $HfO_2$, etc. The third interlayer insulating layer 119 may have a single layer or a plurality of layers including the inorganic insulating material(s) described above.

The first source electrode SE1 and/or the first drain electrode DE1, and/or the second source electrode SE2 and/or the second drain electrode DE2, may include a material having high conductivity, such as a metal and/or a conducting oxide. For example, the first source electrode SE1 and/or the first drain electrode DE1, and/or the second source electrode SE2 and/or the second drain electrode DE2, may include a single layer or a plurality of layers including Al, Cu, Ti, etc. In some embodiments, the first source electrode SE1 and/or the first drain electrode DE1, and/or the second source electrode SE2 and/or the second drain electrode DE2, may include a three-layer structure of a Ti layer, an Al layer, and another Ti layer that are sequentially arranged.

An organic insulating layer 120 may be arranged on the first source electrode SE1 and/or the first drain electrode DE1 and/or the second source electrode SE2 and/or the second drain electrode DE2. The organic insulating layer 120 may include a single layer or a plurality of layers. For example, the organic insulating layer 120 may be provided by stacking a first organic insulating layer 121, a second organic insulating layer 122, and a third organic insulating layer 123. In this case, a second line WL2 may be arranged on the first organic insulating layer 121, and a third line WL3 may be arranged on the second organic insulating layer 122. The second line WL2 and the third line WL3 may be configured to transmit one or more suitable signals and/or voltages to a first pixel circuit PCm.

The organic insulating layer 120 may include one or more suitable general-purpose polymers such as photosensitive PI, PI, polystyrene (PS), polycarbonate (PC), benzocyclobutene (BCB), hexamethyldisiloxane (HMDSO), polymethylmethacrylate (PMMA), or polystrene (PS), polymer derivatives having a phenol-based group, acryl-based polymers, imide-based polymers, aryl ether-based polymers, amide-based polymers, fluorine-based polymers, p-xylene-based polymers, and/or vinyl alcohol-based polymers.

In some embodiments, the organic insulating layer 120 may include a siloxane-based organic material. The siloxane-based organic material may include hexamethyldisiloxane, octamethyltrisiloxane, decamethyltetrasiloxane, dodecamethylpentasiloxane, and/or polydimethylsiloxane. The organic insulating layer 120 may serve as a protective layer covering the first and second thin-film transistors TFT1 and TFT2. The first organic insulating layer 121, the second organic insulating layer 122, and the third organic insulating layer 123 may include the same material as each other, or at least one of them may include a different material, and one or more suitable modifications may be made.

The organic light-emitting diode OLED having a pixel electrode 310, an opposite electrode 330, and an emission layer 320 therebetween may be arranged on the organic insulating layer 120.

The pixel electrode 310 may be connected to the first drain electrode DE1 through a contact hole defined in the organic insulating layer 120, and may be connected to a first drain area of the first thin-film transistor TFT1 by utilizing the first drain electrode DE1. The pixel electrode 310 may be directly connected to the first thin-film transistor TFT1, or may be indirectly connected to the first thin-film transistor TFT1 via another thin-film transistor that performs an emission control function.

The pixel electrode 310 may include a conducting oxide such as ITO, IZO, ZnO, $In_2O_3$, IGO, and/or AZO. The pixel electrode 310 may include a reflective layer including silver (Ag), magnesium (Mg), Al, or any compounds thereof. For example, the pixel electrode 310 may have a structure in which layers including ITO, IZO, ZnO, and/or $In_2O_3$ are on or below the reflective layer described above. In this case, the pixel electrode 310 may have a stacked structure of an ITO layer, an Ag layer, and another ITO layer.

A pixel-defining layer 125 may be arranged on the organic insulating layer 120. The pixel-defining layer 125 may cover an edge of the pixel electrode 310 and have an opening that exposes a central portion of the pixel-defining layer 125 to thereby define a pixel. For example, an emission area of the organic light-emitting diode OLED, and also a size and shape of a first pixel Pm, may be defined by the opening of the pixel-defining layer 125.

In some embodiments, the pixel-defining layer 125 may prevent or reduce an occurrence of an arc and/or the like at an edge of the pixel-defining layer 125 by increasing a distance between the edge of the pixel electrode 310 and the opposite electrode 330 above the pixel electrode 310. The pixel-defining layer 125 described above may include an organic insulating material such as PI, polyamide, acrylic resin, BCB, HMDSO, and/or phenolic resin, and may be provided (e.g., formed) by any suitable method such as spin coating.

In some embodiments, the pixel-defining layer 125 may include an insulating material (e.g., an organic insulating material) including a black pigment or dye. The pixel-defining layer 125 including a light-shielding layer (e.g., including the black pigment or dye) as described above may prevent or reduce color mixing between adjacent pixels, thereby improving the visibility.

The emission layer 320 of the organic light-emitting diode OLED may include a low-molecular weight and/or polymer material, and may be to emit (e.g., may be configured to emit) red, green, blue, and/or white light.

A first common layer and/or a second common layer may be arranged below and above the emission layer 320, respectively. The first common layer is an element arranged below the emission layer 320, and may include, for example, a hole transport layer (HTL), or may include an HTL and a hole injection layer (HIL). The second common layer is an element arranged above the emission layer 320, and may include an electron transport layer (ETL) and/or an electron injection layer (EIL). In some embodiments, the second common layer may not be provided.

While the emission layer 320 may be arranged for each pixel to correspond to openings of the pixel-defining layer 125, each of the first common layer and the second common layer may be integrally provided as a single body to entirely cover the display area DA of the substrate 100, like (similar to) the opposite electrode 330, which will be described in more detail herein below.

The opposite electrode 330 may be arranged on the emission layer 320. The opposite electrode 330 may include a conductive material having a low work function. For example, the opposite electrode 330 may include a (semi-) transparent layer including Ag, Mg, Al, platinum (Pt), lithium (Li), calcium (Ca), or any alloys thereof. In some embodiments, the opposite electrode 330 may further include a layer including ITO, IZO, ZnO, and/or $In_2O_3$ on the (semi-) transparent layer including the above materials. The opposite electrode 330 may be integrally provided as a single body with respect to a plurality of organic light-emitting diodes to correspond to the plurality of pixel electrodes 310.

The organic light-emitting diode OLED implementing (e.g., included in) the first pixel Pm in the first display area DA1 may be arranged to overlap the first pixel circuit PCm. For example, the pixel electrode 310 of the organic light-emitting diode OLED may overlap at least one of the thin-film transistors included in the first pixel circuit PCm.

Figure 7:
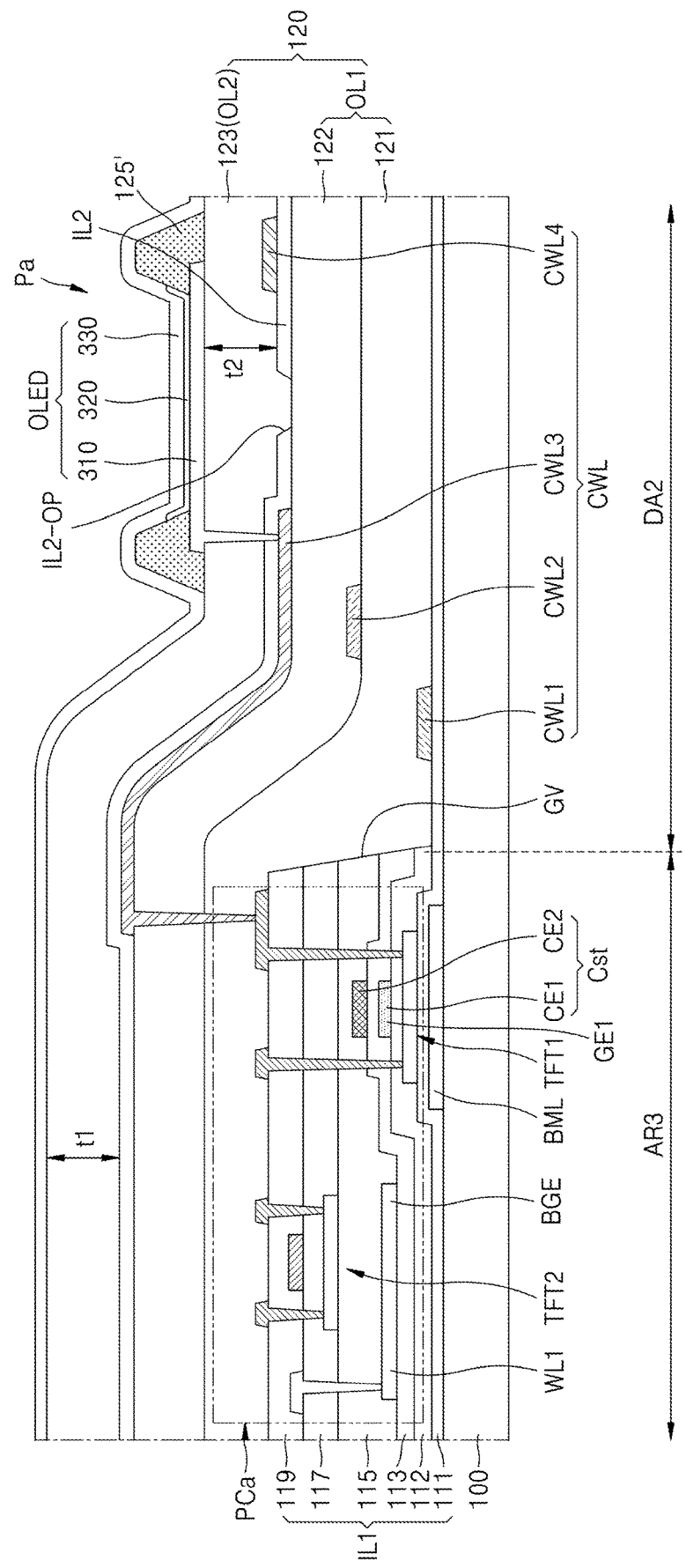
FIG. 7 is a schematic cross-sectional view illustrating a portion of a display panel according to one or more embodiments.
Figure 8:
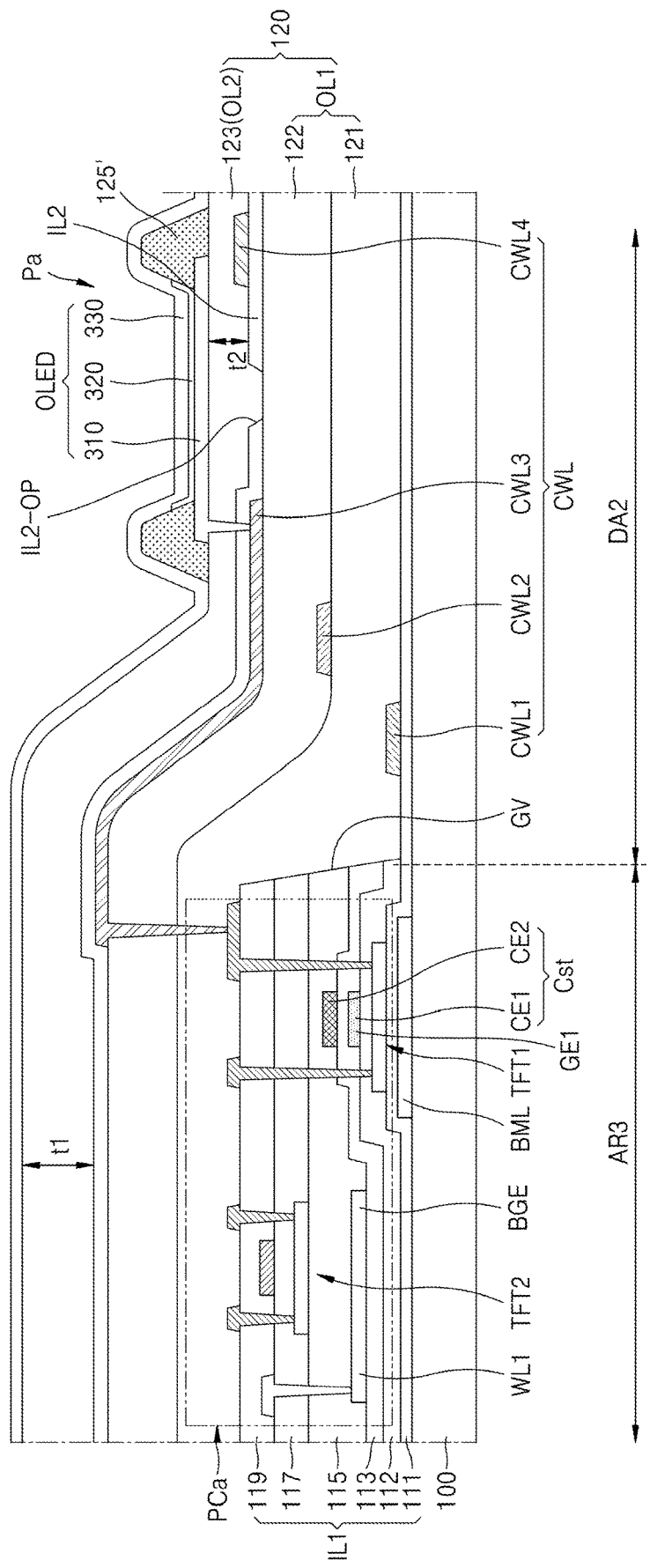
FIG. 8 is a schematic cross-sectional view illustrating a portion of a display panel according to one or more embodiments.

FIGS. 7 and 8 are schematic cross-sectional views illustrating a portion of a display panel according to one or more embodiments, and are cross-sectional views schematically illustrating a portion of a second display area DA2 and a third area AR3. The third area AR3 may be the third display area DA3 or the peripheral area DPA described above. In FIGS. 7 and 8, the same reference symbols as those of FIG. 6 denote the same elements, and duplicative descriptions thereof are not provided.

Referring to FIG. 7, an organic light-emitting diode OLED may be arranged in the second display area DA2 of the display panel 10 as a second display element implementing (e.g., included in) a second pixel Pa. The second pixel circuit PCa connected (e.g., electrically coupled) to the second display element may be arranged in the third area AR3 of the display panel 10.

The second pixel circuit PCa may include a first thin-film transistor TFT1, a second thin-film transistor TFT2, and a storage capacitor Cst, the first thin-film transistor TFT1 including a silicon semiconductor, and the second thin-film transistor TFT2 including an oxide semiconductor. A lower conductive layer BML may be further arranged between a substrate 100 and the second pixel circuit PCa. The lower conductive layer BML may overlap the first thin-film transistor TFT1. Elements included in the second pixel circuit PCa are similar to those included in the first pixel circuit PCm, and thus, a description of the second pixel circuit PCa may be similar to a description of the first pixel circuit PCm.

The second pixel circuit PCa, which is arranged outside of the second display area DA2, for example, in the third area AR3, may be electrically connected to the organic light-emitting diode OLED by utilizing a connection line CWL, the organic light-emitting diode OLED being a second display element arranged in the second display area DA2.

The connection line CWL may be provided in plurality, and the plurality of connection lines CWL may include connection lines CWL arranged on different layers from each other. For example, the plurality of connection lines CWL may include first to fourth connection lines CWL1 to CWL4 arranged on different layers from each other. Some of the connection lines CWL described above may be provided as opaque lines, and other lines may be provided as transparent lines.

For example, the first connection line CWL1 may have the same material as at least one of conductive layers included in the second pixel circuit PCa. In some embodiments, the first connection line CWL1 may be concurrently (e.g., simultaneously) provided (e.g., formed) with at least one of the conductive layers included in the second pixel circuit PCa.

For example, the first connection line CWL1 may have the same material as a first semiconductor layer, a first gate electrode GE1, a first source electrode, and a first drain electrode of the first thin-film transistor TFT1, a lower electrode CE1 and an upper electrode CE2 of the storage capacitor Cst, and a second semiconductor layer, a lower gate electrode BGE, a second gate electrode, a second source electrode, and a second drain electrode of the second thin-film transistor TFT2. In some embodiments, the first connection line CWL1 may have the same material as the lower conductive layer BML. The first connection line CWL1 may be provided as an opaque line or a transparent line.

In some embodiments, a first inorganic insulating layer IL1 of the display panel may include a groove GV corresponding to the second display area DA2, and at least a portion of the first connection line CWL1 may be arranged in the groove GV.

For example, when a buffer layer 111, a first gate insulating layer 112, a second gate insulating layer 113, a first interlayer insulating layer 115, a second interlayer insulating layer 117, and a third interlayer insulating layer 119 are collectively referred to as the first inorganic insulating layer IL1, the first gate insulating layer 112 may have the groove GV or opening corresponding to the second display area DA2.

The groove GV may be provided by removing a portion of the first inorganic insulating layer IL1. For example, the buffer layer 111 may be continuously arranged in the second display area DA2, and each of the second gate insulating layer 113, the first interlayer insulating layer 115, the second interlayer insulating layer 117, and the third interlayer insulating layer 119 may have an opening corresponding to the second display area DA2. The openings may be separately provided in separate processes, or may be concurrently (e.g., simultaneously) provided in substantially the same process. When the openings are provided in separate processes, an inner surface of the groove GV may not be smooth and may have a staircase-shaped step.

In FIG. 7, an opening is provided in the second gate insulating layer 113, the first interlayer insulating layer 115, the second interlayer insulating layer 117, and the third interlayer insulating layer 119 to correspond to the groove GV of the first inorganic insulating layer IL1. However, the present disclosure is not limited thereto. An opening may not be provided in some of the second gate insulating layer 113, the first interlayer insulating layer 115, the second interlayer insulating layer 117, and the third interlayer insulating layer 119.

In some embodiments, the first inorganic insulating layer IL1 may have an opening corresponding to the second display area DA2. For example, an opening may also be provided in the buffer layer 111 so that an upper surface of the substrate 100 is exposed. In another embodiment, the first inorganic insulating layer IL1 may be continuously arranged to correspond to the second display area DA2 (e.g., may be in the second display area DA2), without having an opening or groove corresponding to the second display area DA2.

The first connection line CWL1 may be arranged in the groove GV or opening of the first inorganic insulating layer IL1 in the second display area DA2. The organic insulating layer 120 may be arranged above the first connection line CWL1. For example, a first organic insulating layer 121 to a third organic insulating layer 123 may be arranged above the first connection line CWL1.

The first organic insulating layer 121 to the third organic insulating layer 123 may be arranged to fill the groove GV while covering the first connection line CWL1 arranged in the groove GV. The first connection line CWL1 may be arranged between the substrate 100 and the first organic insulating layer 121 in the second display area DA2. The organic insulating layer 120 may have a greater light transmittance than that of the first inorganic insulating layer IL1. Accordingly, a light transmittance of the second display area DA2 may be further improved. In some embodiments, the organic insulating layer 120 may absorb shock that may be applied to the connection line CWL due to characteristics of an organic material and may protect the connection line CWL from forming cracks.

The second connection line CWL2 may be arranged on the first organic insulating layer 121, and the third connection line CWL3 and the fourth connection line CWL4 may be arranged on the second organic insulating layer 122. In some embodiments, the third connection line CWL3 may be arranged between the second organic insulating layer 122 and a second inorganic insulating layer IL2 to be described in more detail herein below, and the fourth connection line CWL4 may be arranged on the second inorganic insulating layer IL2.

The second connection line CWL2 to the fourth connection line CWL4 may be provided as opaque lines or transparent lines. When the second connection line CWL2 to the fourth connection line CWL4 are provided as opaque lines, each of the second connection line CWL2 to the fourth connection line CWL4 may include a metal such as Mo, Al, Cu, and/or Ti, and may include a single layer or a plurality of layers.

When the second connection line CWL2 to the fourth connection line CWL4 are provided as transparent lines, the second connection line CWL2 may include a transparent conducting oxide (TCO). For example, the second connection line CWL2 may include a conducting oxide such as ITO, IZO, ZnO, $In_2O_3$, IGO, and/or AZO. The second connection line CWL2 to the fourth connection line CWL4 may be provided in substantially the same process as a line arranged in a first display area, or may be formed in separate processes.

One end of the connection line CWL may be connected to the second pixel circuit PCa, and the other end may be connected to a pixel electrode 310 of the organic light-emitting diode OLED. FIG. 7 shows a structure in which the third connection line CWL3 is connected to the second pixel circuit PCa and the organic light-emitting diode OLED. One end of the third connection line CWL3 may be connected to the thin-film transistor TFT1 of the second pixel circuit PCa through a contact hole penetrating through the second organic insulating layer 122 and the first organic insulating layer 121. The pixel electrode 310 of the organic light-emitting diode OLED may be connected to the other end of the third connection line CWL3 through a contact hole penetrating through the third organic insulating layer 123 and the second inorganic insulating layer IL2.

The connection line CWL and the second pixel circuit PCa may be connected in one or more suitable ways, such as through a contact hole, through an intermediate electrode, and/or directly on the same layer. Similarly, the connection line CWL and the organic light-emitting diode OLED may be connected in one or more suitable ways, such as through a contact hole, through an intermediate electrode, and/or directly on the same layer.

In the present embodiments, the second inorganic insulating layer IL2 may be arranged in the second display area DA2. The second inorganic insulating layer IL2 may be arranged between the first to third organic insulating layers 121, 122, and 123, or may be arranged on the organic insulating layer 120.

In FIG. 7, the second inorganic insulating layer IL2 is arranged between the second organic insulating layer 122 and the third organic insulating layer 123. However, the present disclosure is not limited thereto. The second inorganic insulating layer IL2 may be arranged between the first organic insulating layer 121 and the second organic insulating layer 122, or may be arranged on the third organic insulating layer 123, and one or more suitable modifications may be made.

When the organic insulating layer 120 (e.g., a portion of the organic insulating layer 120) arranged below the second inorganic insulating layer IL2 is referred to as a lower-organic insulating layer OL1, and the organic insulating layer 120 (e.g., a portion of the organic insulating layer 120) arranged on the second inorganic insulating layer IL2 is referred to as an upper-organic insulating layer OL2, it may be considered that the second inorganic insulating layer IL2 may be arranged between the lower-organic insulating layer OL1 and the upper-organic insulating layer OL2. In some embodiments, when the second inorganic insulating layer IL2 is arranged on the organic insulating layer 120, the upper-organic insulating layer OL2 may not be arranged between the second inorganic insulating layer IL2 and the pixel electrode 310.

The second inorganic insulating layer IL2 may be introduced to increase the number of connection lines CWL arranged on different layers. As the number of second display elements arranged in the second display area DA2 increases, more connection lines CWL may be required, and considering the light transmittance of the second display area DA2, it may be necessary to properly or suitably arrange the connection lines CWL. As the second inorganic insulating layer IL2 is introduced, the connection lines CWL arranged on different layers may be added so that the connection lines CWL partially overlap each other. In some embodiments, the connection lines CWL may be added by introducing an additional organic insulating layer, in addition to the second inorganic insulating layer IL2. However, because organic insulating layers are provided thicker than inorganic insulating layers due to characteristics thereof, it may be more preferable or desired to properly or suitably combine the organic insulating layers with the inorganic insulating layers.

In some embodiments, the second inorganic insulating layer IL2 may be introduced to improve the light diffraction phenomenon in the second display area DA2. A refractive index of the second inorganic insulating layer IL2 may have a value between a refractive index of the organic insulating layer 120 and a refractive index of the connection line CWL including a transparent line. By appropriately or suitably arranging the second inorganic insulating layer IL2 between the organic insulating layers 120, the light diffraction phenomenon that may occur between the organic insulating layer 120 and the connection line CWL may be improved.

The second inorganic insulating layer IL2 may include an opening IL2-OP exposing an upper surface of the lower-organic insulating layer OL1. The opening IL2-OP may be a passage through which gases that may be generated in the lower-organic insulating layer OL1 may be emitted (e.g., to the outside). For example, the opening IL2-OP may be an outgassing hole.

When the opening IL2-OP is not provided in the second inorganic insulating layer IL2, a layer lifting phenomenon of the second inorganic insulating layer IL2 may occur due to the gases generated in the lower-organic insulating layer OL1. According to the present embodiments, as the opening IL2-OP is provided in the second inorganic insulating layer IL2, defects due to layer lifting may be prevented or reduced.

The second inorganic insulating layer IL2 may be arranged to correspond to the second display area DA2. The second inorganic insulating layer IL2 may also be arranged in the first display area and/or the third area AR3. In some embodiments, the second inorganic insulating layer IL2 may be arranged only in the second display area DA2 and the third area AR3, and not in the first display area.

The second inorganic insulating layer IL2 may include $SiO_2$, $SiN_x$, $SiO_xN_y$, $Al_2O_3$, $TiO_2$, $Ta_2O_5$, and/or $HfO_2$. The second inorganic insulating layer IL2 may be a single layer or a plurality of layers including the inorganic insulating material(s) described above.

A pixel-defining layer 125' arranged in the second display area DA2 may be arranged to be apart from the pixel-defining layer arranged in the first display area. The pixel-defining layer 125' may include a light-shielding material. For example, the pixel-defining layer 125' may include an insulating material (e.g., an organic insulating material) including a black pigment or dye. The pixel-defining layer 125' including the light-shielding material as described above may prevent or reduce color mixing between adjacent pixels and absorb light reflected from the component 40 (see FIG. 2) toward the display panel 10, thereby improving the visibility. As the pixel-defining layer 125' includes the light-shielding material, the pixel-defining layer 125' arranged in the second display area DA2 may be patterned for each second pixel Pa. The pixel-defining layer 125' may cover an edge of the pixel electrode 310 and may have an opening exposing a central portion of the pixel electrode 310, and thus the pixel-defining layer 125' may have a ring shape or a donut shape in a plan view. In some embodiments, the opening of the pixel-defining layer 125' may have a circular shape in a plan view. In some embodiments, the opening of the pixel-defining layer 125' may have an elliptical shape or a polygonal shape with round edges.

As shown in FIG. 7, a thickness t2 of the third organic insulating layer 123 arranged in the second display area DA2 may be equal to a thickness t1 of the third organic insulating layer 123 arranged in the third area AR3. In one or more embodiments, the first organic insulating layer 121 and the second organic insulating layer 122 may have the same thickness in the second display area DA2 and in the third area AR3.

In other one or more embodiments, referring to FIG. 8, the thickness t2 of the third organic insulating layer 123 arranged in the second display area DA2 may be less than the thickness t1 of the third organic insulating layer 123 arranged in the first display area and the third area AR3. To this end, the third organic insulating layer 123 may be provided (e.g., formed) utilizing a half-tone mask process. Because the thickness t2 of the third organic insulating layer 123 is relatively small in the second display area DA2, the light transmittance of the second display area DA2 may be increased. Similarly, thicknesses of the first organic insulating layer 121 and/or the second organic insulating layer 122 in the second display area DA2 may be less than thicknesses of the first organic insulating layer 121 and/or the second organic insulating layer 122 in the first display area and the third area AR3.

Figure 9:
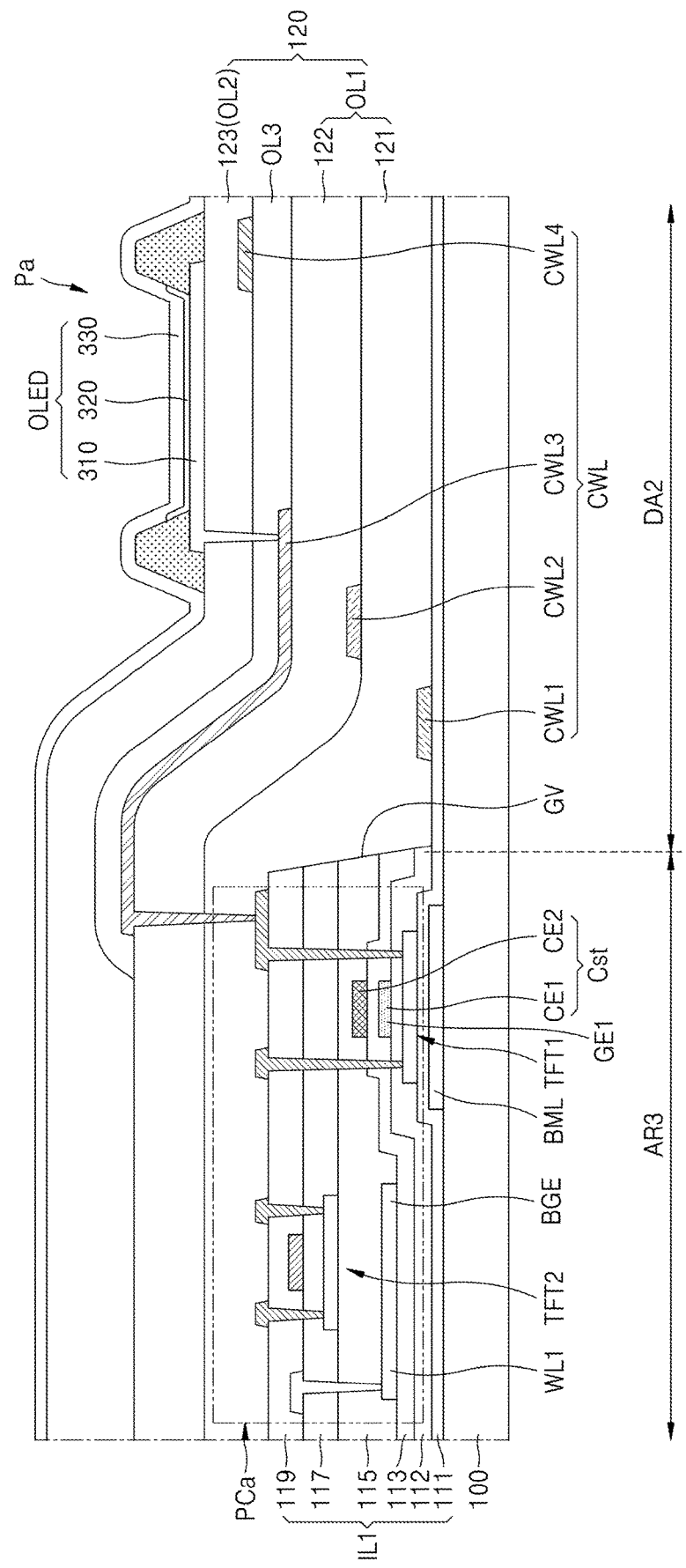
FIG. 9 is a schematic plan layout view illustrating a portion of a display panel according to one or more embodiments.

FIG. 9 is a schematic cross-sectional view illustrating a portion of a display panel according to one or more embodiments. In FIG. 9, the same reference symbols as those of FIGS. 6 and 7 denote the same elements, and duplicative descriptions thereof are not provided.

Referring to FIG. 9, an additional organic insulating layer OL3 may be arranged in the second display area DA2. The additional organic insulating layer OL3 may be an organic insulating layer not arranged in the first display area. The additional organic insulating layer OL3 may be arranged between the second organic insulating layer 122 and the third organic insulating layer 123. In one or more other embodiments, the additional organic insulating layer OL3 may be arranged between the third organic insulating layer 123 and the pixel electrode 310.

The additional organic insulating layer OL3 may include one or more suitable general-purpose polymers such as photosensitive PI, PI, PS, PC, BCB, HMDSO, and/or PMMA, polymer derivatives having a phenol-based group, acryl-based polymers, imide-based polymers, aryl ether-based polymers, amide-based polymers, fluorine-based polymers, p-xylene-based polymers, and/or vinyl alcohol-based polymers.

In some embodiments, the additional organic insulating layer OL3 may include a siloxane-based organic material. The siloxane-based organic material may include hexamethyldisiloxane, octamethyltrisiloxane, decamethyltetrasiloxane, dodecamethylpentasiloxane, and/or polydimethylsiloxane.

Figure 10:
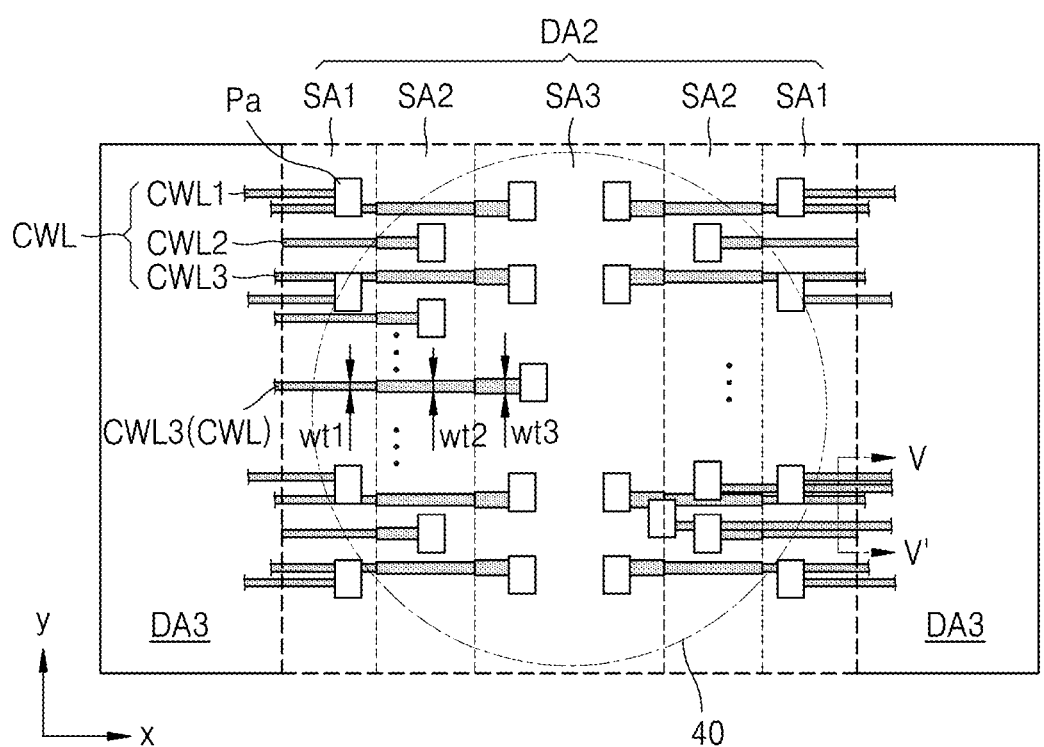
FIG. 10 is a schematic plan layout view illustrating a portion of a display panel according to one or more embodiments.

FIG. 10 is a schematic plan layout view illustrating a portion of a display panel according to one or more embodiments. For example, a second display area DA2 and a third display area DA3, arranged at opposite sides of the second display area DA2, are shown.

Referring to FIG. 10, second pixels Pa may be arranged in the second display area DA2. The second pixels Pa may be arranged in one or more suitable pixel arrangement structures such as a PenTile® structure (PENTILE® is a registered trademark owned by Samsung Display Co., Ltd.), a stripe structure, and/or a delta structure. The third display area DA3 may be arranged on left and right sides of the second display area DA2. The second pixel circuits PCa (see FIG. 4) for driving the second pixels Pa may be arranged in the third display area DA3. A component 40 may be arranged to correspond to the second display area DA2.

Each of the second pixel circuits PCa arranged in the third display area DA3 may be connected to a display element implementing the second pixel Pa by utilizing a connection line CWL. The connection line CWL may extend in an x direction or a −x direction. For example, the connection line CWL extending to the second display area DA2 from the third display area DA3 arranged on the left side of the second display area DA2 may extend in the x direction, and the connection line CWL extending to the second display area DA2 from the third display area DA3 arranged on the right side of the second display area DA2 may extend in the −x direction.

In the present embodiments, the connection line CWL may include portions having different widths according to a position thereof in the second display area DA2.

The second display area DA2 may include a first sub-area SA1, a second sub-area SA2, and a third sub-area SA3. The first sub-area SA1 may include an area of the second display area DA2 that is arranged at an edge (e.g., side) adjacent to the third display area DA3. The third sub-area SA3 may include an area arranged at a center portion of the second display area DA2. The second sub-area SA2 may include an area arranged between the first sub-area SA1 and the respective third sub-area SA3.

The plurality of connection lines CWL arranged in the second display area DA2 may include a first connection line CWL1 extending to the first sub-area SA1, a second connection line CWL2 extending to the second sub-area SA2, and a third connection line CWL3 extending to the third sub-area SA3.

In this case, all of the first connection line CWL1, the second connection line CWL2, and the third connection line CWL3 are arranged in the first sub-area SA1, but only the second connection line CWL2 and the third connection line CWL3 may be arranged in the second sub-area SA2, and only the third connection line CWL3 may be arranged in the third sub-area SA3.

When the first connection line CWL1, the second connection line CWL2, and the third connection line CWL3 are provided to have the same thickness, light transmittances of the first sub-area SA1, the second sub-area SA2, and the third sub-area SA3 may be different from each other, and thus, light or a signal received or transmitted by the component 40 may not be substantially uniform depending on an area.

In the present embodiments, the connection line CWL may have different widths (e.g., thicknesses) according to a position thereof in the second display area DA2 so that the light transmittance of the second display area DA2 may be substantially uniform, and thus, the performance of a function of the component 40 may be improved.

The connection line CWL arranged in the first sub-area SA1 may have a first width wt1, the connection line CWL arranged in the second sub-area SA2 may have a second width wt2, and the connection line CWL arranged in the third sub-area SA3 may have a third width wt3. The third width wt3 may be greater than the second width wt2, and the second width wt2 may be greater than the first width wt1. (wt3>wt2>wt1) In this case, the first width wt1, the second width wt2, and the third width wt3 may be widths according to a direction perpendicular (or substantially perpendicular) to a direction in which the connection line CWL extends in a longitudinal direction. In some embodiments, the first width wt1 may be about 2 µm to about 2.5 µm, the second width wt2 may be about 2.5 µm to about 3 µm, and the third width wt3 may be about 3 µm to about 3.5 µm.

The first connection line CWL1 is arranged only in the first sub-area SA1, and thus, the first connection line CWL1 may be provided only with the first width wt1. The second connection line CWL2 may include a portion having the first width wt1 and a portion having the second width wt2. The third connection line CWL3 may include a portion having the first width wt1, a portion having the second width wt2, and a portion having the third width wt3.

Figure 11:
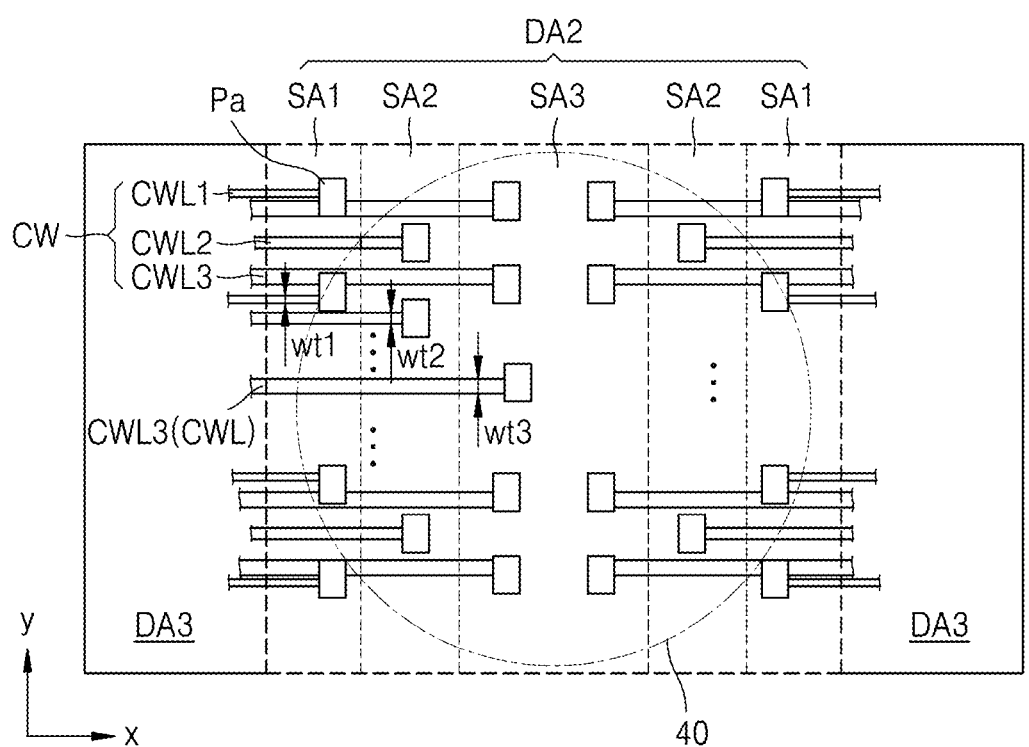
FIG. 11 is a schematic plan layout view illustrating a portion of a display panel according to one or more embodiments.

FIG. 11 is a schematic plan layout view illustrating a portion of a display panel according to one or more embodiments. In FIG. 11, the same reference symbols as those of FIG. 10 denote the same elements, and duplicative descriptions thereof will not be provided.

Referring to FIG. 11, a connection line CWL may include a first connection line CWL1, a second connection line CWL2, and/or a third connection line CWL3 having different thicknesses from one another. For example, the first connection line CWL1 may have the first width wt1, the second connection line CWL2 may have the second width wt2, and the third connection line CWL3 may have the third width wt3. In this case, a length of the first connection line CWL1 may be smaller than a length of the second connection line CWL2, and the length of the second connection line CWL2 may be smaller than a length of the third connection line CWL3. The third width wt3 may be greater than the second width wt2, and the second width wt2 may be greater than the first width wt1. (wt3>wt2>wt1)

Because the first connection line CWL1, the second connection line CWL2, and/or the third connection line CWL3 may have different lengths from each other, widths thereof may be determined according to the lengths so that a resistance of each of the connection lines CWL may be uniformly provided.

In some embodiments, the first connection line CWL1, the second connection line CWL2, and/or the third connection line CWL3 may have different materials, and thus may have different non-resistance values from each other. Accordingly, even the connection lines CWL having the same length may have different widths so that a resistance value thereof may be uniformly designed.

Figure 12:
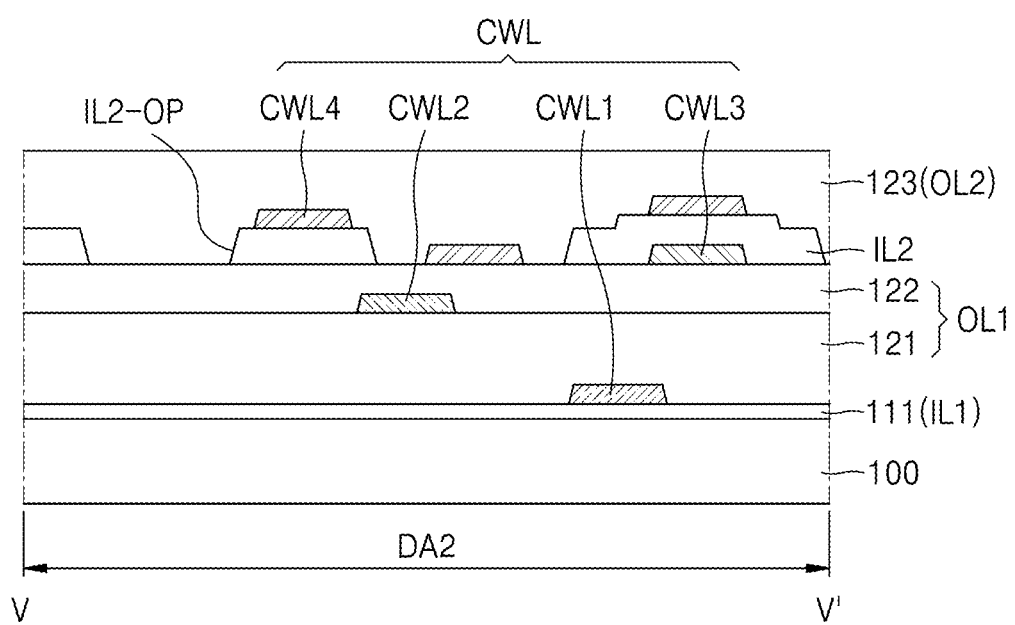
FIG. 12 is a schematic cross-sectional view illustrating a portion of a display panel according to one or more embodiments.

FIG. 12 is a schematic cross-sectional view illustrating a portion of the display panel in FIG. 10, taken along line V-V' in FIG. 10. For example, FIG. 12 is a cross-sectional view illustrating the connection lines CWL that may be arranged in the second display area DA2.

Referring to FIG. 12, a plurality of insulating layers of a first inorganic insulating layer IL1, a lower-organic insulating layer OL1, a second inorganic insulating layer IL2, and an upper-organic insulating layer OL2 may be stacked in the second display area DA2 of the substrate 100. The second inorganic insulating layer IL2 may include an opening IL2-OP exposing an upper surface of the lower-organic insulating layer OL1. Gas that may be generated in the lower-organic insulating layer OL1 may be emitted to the outside through the opening IL2-OP.

The lower-organic insulating layer OL1 may be an organic insulating layer arranged below the second inorganic insulating layer IL2, and in the present embodiments, the lower-organic insulating layer OL1 may include a first organic insulating layer 121 and a second organic insulating layer 122. The upper-organic insulating layer OL2 may be an organic insulating layer arranged between an upper portion of the second inorganic insulating layer IL2 and the pixel electrode 310 (see FIG. 9) of a display element, and in the present embodiments, the upper-organic insulating layer OL2 may include a third organic insulating layer 123.

The connection lines CWL may be arranged between the plurality of insulating layers or above the plurality of insulating layers. The connection line CWL may include first to fourth connection lines CWL1 to CWL4 arranged on different layers from each other in the second display area DA2.

The first connection line CWL1 may be arranged on a buffer layer 111 within a groove of the first inorganic insulating layer IL1. When the groove is not provided in the first inorganic insulating layer IL1, the first connection line CWL1 may be arranged on an upper surface of the first inorganic insulating layer IL1. The first connection line CWL1 may be arranged between the buffer layer 111 and the first organic insulating layer 121.

The second connection line CWL2 may be arranged on the first organic insulating layer 121. The second connection line CWL2 may be arranged between the first organic insulating layer 121 and the second organic insulating layer 122.

The third connection line CWL3 may be arranged on the second organic insulating layer 122. The third connection line CWL3 may be arranged between the second organic insulating layer 122 and the second inorganic insulating layer IL2. The third connection line CWL3 may be covered with the second inorganic insulating layer IL2.

The fourth connection line CWL4 may be arranged on the second inorganic insulating layer IL2. The fourth connection line CWL4 may be arranged between the second inorganic insulating layer IL2 and the third organic insulating layer 123. The second inorganic insulating layer IL2 includes the opening IL2-OP, and thus, some of the fourth connection line CWL4 may be arranged on the second organic insulating layer 122 in the opening IL2-OP of the second inorganic insulating layer IL2.

The upper-organic insulating layer OL2, for example, the third organic insulating layer 123, may be arranged to cover the fourth connection line CWL4. The organic light-emitting diode OLED (see FIG. 9) may be arranged on the third organic insulating layer 123.

In one or more embodiments, at least some of the first to fourth connection lines CWL1 to CWL4 may overlap each other. Thus, a plurality of connection lines CWL may be introduced without an increase in an area in which the connection lines CWL are arranged. In some embodiments, as the plurality of connection lines CWL may be introduced, more second display elements may be arranged in the second display area DA2, and thus, an area of the second display area DA2 may be extended.

In one or more embodiments, some of the first to fourth connection lines CWL1 to CWL4 may include a metal, and other ones may include a TCO. However, the present disclosure is not limited thereto. All of the first to fourth connection lines CWL1 to CWL4 may include a metal, or all of the first to fourth connection lines CWL1 to CWL4 may include a TCO, and one or more suitable modifications may be made.

In one or more embodiments, the first to fourth connection lines CWL1 to CWL4 may have one or more suitable widths according to lengths and materials thereof.

Figure 13:
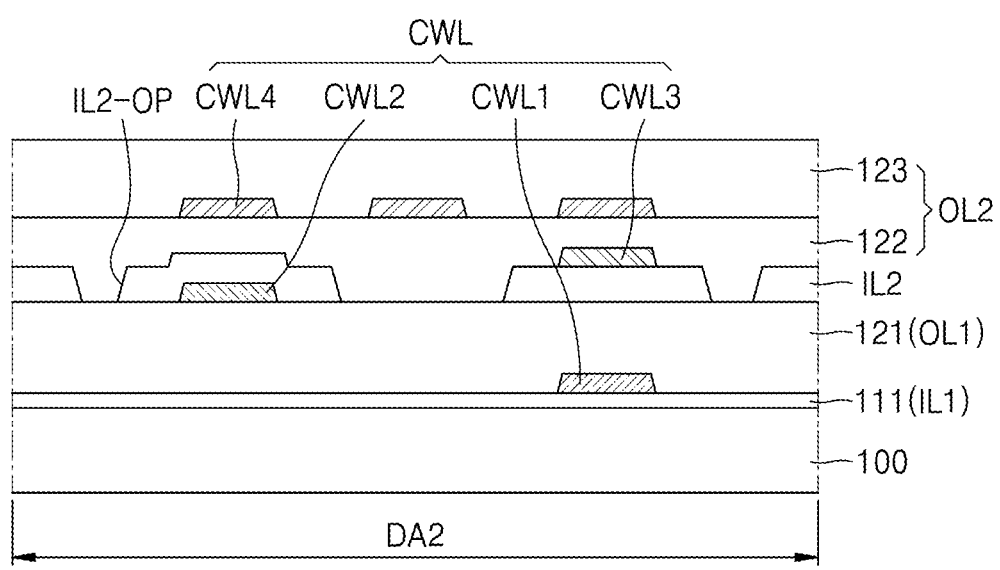
FIG. 13 is a schematic cross-sectional view illustrating a portion of a display panel according to one or more embodiments.

FIG. 13 is a schematic cross-sectional view illustrating a portion of the display panel in FIG. 10, taken along line V-V' in FIG. 10. In FIG. 13, the same reference symbols as those of FIG. 12 denote the same elements, and duplicative descriptions thereof are not provided.

Referring to FIG. 13, a plurality of insulating layers of the first inorganic insulating layer IL1, the lower-organic insulating layer OL1, the second inorganic insulating layer IL2, and the upper-organic insulating layer OL2 may be stacked in the second display area DA2 of the substrate 100. The second inorganic insulating layer IL2 may include an opening IL2-OP exposing an upper surface of the lower-organic insulating layer OL1. Gas that may be generated in the lower-organic insulating layer OL1 may be emitted to the outside through the opening IL2-OP.

In the present embodiments, the second inorganic insulating layer IL2 may be arranged on the first organic insulating layer 121. The second inorganic insulating layer IL2 may be arranged between the first organic insulating layer 121 and the second organic insulating layer 122. In the present embodiments, the lower-organic insulating layer OL1 may be the first organic insulating layer 121, and the upper-organic insulating layer OL2 may include the second organic insulating layer 122 and the third organic insulating layer 123.

The connection lines CWL may be arranged between the plurality of insulating layers or above the plurality of insulating layers. The connection line CWL may include first to fourth connection lines CWL1 to CWL4 arranged on different layers from each other in the second display area DA2. As the second inorganic insulating layer IL2 is arranged between the first organic insulating layer 121 and the second organic insulating layer 122, the third connection line CWL3 may be arranged on the second inorganic insulating layer IL2.

Figure 14:
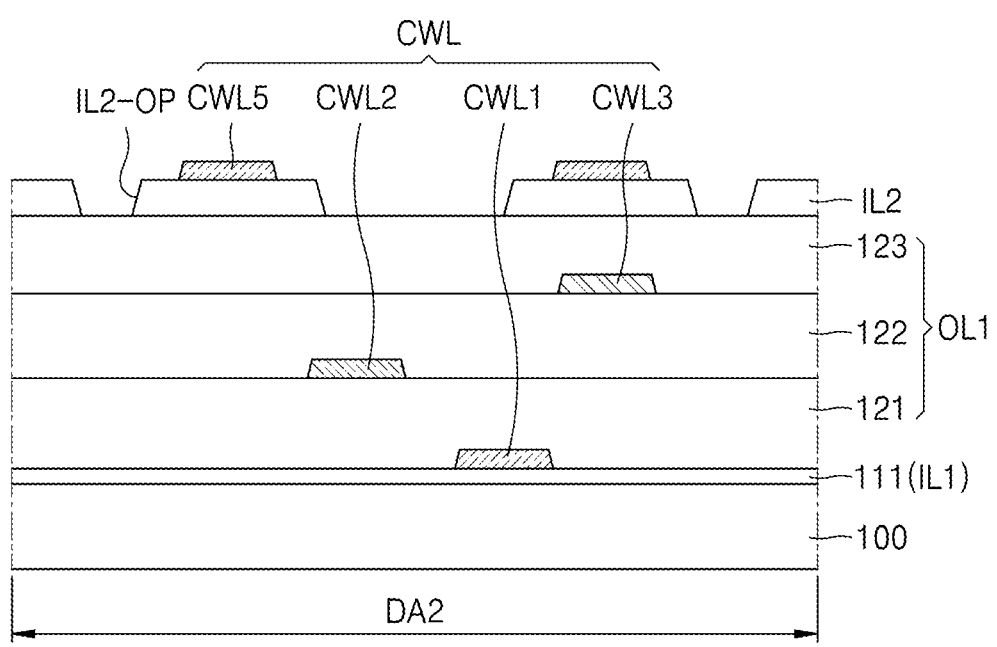
FIG. 14 is a schematic cross-sectional view illustrating a portion of a display panel according to one or more embodiments.

FIG. 14 is a schematic cross-sectional view illustrating a portion of the display panel in FIG. 10, taken along line V-V' in FIG. 10. In FIG. 14, the same reference symbols as those of FIG. 12 denote the same elements, and duplicative descriptions thereof are not provided.

Referring to FIG. 14, a plurality of insulating layers of the first inorganic insulating layer IL1, the lower-organic insulating layer OL1, the second inorganic insulating layer IL2, and the upper-organic insulating layer OL2 may be stacked in the second display area DA2 of the substrate 100. The second inorganic insulating layer IL2 may include an opening IL2-OP exposing an upper surface of the lower-organic insulating layer OL1. Gas that may be generated in the lower-organic insulating layer OL1 may be emitted to the outside through the opening IL2-OP.

In the present embodiments, the second inorganic insulating layer IL2 may be arranged on the third organic insulating layer 123. In the present embodiments, the lower-organic insulating layer OL1 may include the first organic insulating layer 121, the second organic insulating layer 122, and the third organic insulating layer 123, and the upper-organic insulating layer OL2 may not be provided. For example, the pixel electrode 310 (see FIG. 9) of a display element may be arranged on the second inorganic insulating layer IL2.

The connection lines CWL may be arranged between the plurality of insulating layers or above the plurality of insulating layers. The connection line CWL may include first to fourth connection lines CWL1 to CWL4 arranged on different layers from each other in the second display area DA2. As the second inorganic insulating layer IL2 is arranged on the third organic insulating layer 123, the connection line CWL may further include a fifth connection line CWL5 on the second inorganic insulating layer IL2. The fifth connection line CWL5 may be arranged on the same layer as a layer on which the pixel electrode 310 (see FIG. 9) of the display element is arranged, and may include the same material(s) as the pixel electrode 310.

Figure 15:
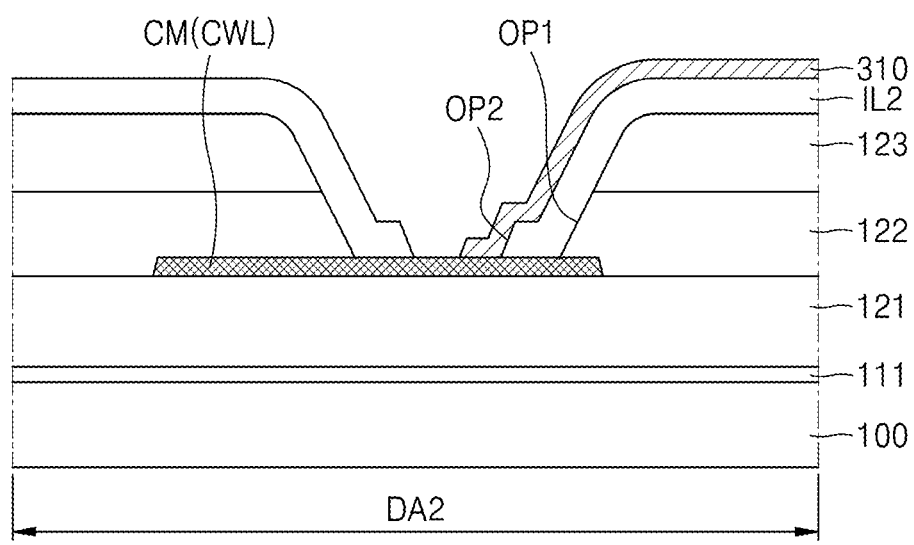
FIG. 15 is a schematic cross-sectional view illustrating a portion of a display panel according to one or more embodiments.
Figure 16:
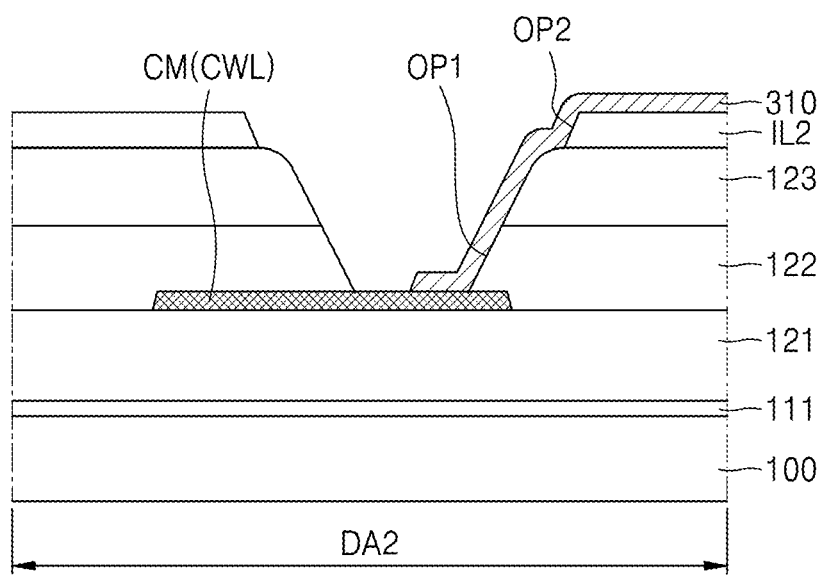
FIG. 16 is a schematic cross-sectional view illustrating a portion of a display panel according to one or more embodiments.

FIGS. 15 and 16 are schematic cross-sectional views illustrating a portion of a display panel according to one or more embodiments. For example, FIGS. 15 and 16 show a structure of a portion where the pixel electrode 310 and a connection electrode CM are in contact with each other when the second inorganic insulating layer IL2 is arranged between the third organic insulating layer 123 and the pixel electrode 310.

Referring to FIGS. 15 and 16, a connection electrode CM may be arranged on the first organic insulating layer 121. The connection electrode CM may be an intermediate electrode or the connection line CWL connecting a second pixel circuit PCa and the pixel electrode 310 to each other. The connection electrode CM may be arranged on an insulating layer other than the first organic insulating layer 121. For example, the connection electrode CM may be arranged on the buffer layer 111.

The second organic insulating layer 122 and the third organic insulating layer 123 may be arranged on the connection electrode CM, and may include a first opening OP1 exposing a portion of the connection electrode CM. The second inorganic insulating layer IL2 may be arranged on the third organic insulating layer 123, and may include a second opening OP2 overlapping the first opening OP1. The second opening OP2 may serve as a contact hole and at the same time may serve to allow gas generated in the second organic insulating layer and the third organic insulating layer 123 to escape.

Referring to FIG. 15, an area of the first opening OP1 may be greater than an area of the second opening OP2. Accordingly, a portion of the second inorganic insulating layer IL2 may be arranged in the first opening OP1. In some embodiments, the second opening OP2 may be arranged in the first opening OP1. The pixel electrode 310 may be in contact with the connection electrode CM through the second opening OP2.

Referring to FIG. 16, an area of the first opening OP1 may be less than an area of the second opening OP2. Accordingly, the second inorganic insulating layer IL2 may not be arranged in the first opening OP1. The pixel electrode 310 may be arranged on a side surface of the first opening OP1, and may be in contact with the connection electrode CM through the first opening OP1.

As described above, in the display panel and the display apparatus according to the embodiments, a pixel circuit is not arranged in a second display area where a component (e.g., component 40) is arranged, thus ensuring a wider transmission area and improving the transmittance.

In some embodiments, in the display panel and the display apparatus according to the embodiments, connection lines arranged on different layers from each other may be in the second display area, and thus, the second display area (e.g., the overall display area) may be easily or suitably extended. However, the scope of the present disclosure is not limited by this effect.

The display apparatus and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

It should be understood that embodiments described herein should be considered in a descriptive sense only and not for purposes of limitation. Descriptions of features or aspects within each of the embodiments should typically be considered as available for other similar features or aspects in other embodiments. While one or more embodiments have been described with reference to the drawings, it will be understood by those of ordinary skill in the art that one or more suitable changes in form and details may be made therein without departing from the spirit and scope of the present disclosure included in the following claims and equivalents thereof.

What is claimed is:

1. A display panel comprising:
a substrate comprising a first display area comprising a plurality of first display elements, and a second display area comprising a plurality of second display elements;
a plurality of first pixel circuits in the first display area and respectively connected to the plurality of first display elements;
a plurality of second pixel circuits outside of the second display area and respectively connected to the plurality of second display elements;
a plurality of connection lines connecting the plurality of second display elements to the plurality of second pixel circuits;
a first inorganic insulating layer on the substrate;
a lower-organic insulating layer on the first inorganic insulating layer; and
a second inorganic insulating layer on the lower-organic insulating layer in the second display area,
wherein the second inorganic insulating layer comprises an opening exposing an upper surface of the lower-organic insulating layer, and the second inorganic insulating layer is disposed over at least one of the plurality of connection lines.

2. A display panel comprising:
a substrate comprising a first display area comprising a plurality of first display elements, and a second display area comprising a plurality of second display elements;
a plurality of first pixel circuits in the first display area and respectively connected to the plurality of first display elements;
a plurality of second pixel circuits outside of the second display area and respectively connected to the plurality of second display elements;
a plurality of connection lines connecting the plurality of second display elements to the plurality of second pixel circuits;
a first inorganic insulating layer on the substrate;
a lower-organic insulating layer on the first inorganic insulating layer; and
a second inorganic insulating layer on the lower-organic insulating layer in the second display area,
wherein the second inorganic insulating layer comprises an opening exposing an upper surface of the lower-organic insulating layer,
wherein the plurality of connection lines comprise a first connection line and a second connection line arranged on different layers from each other, and
the first connection line and the second connection line comprise different materials from each other.

3. The display panel of claim 2, wherein the first connection line comprises a metal, and the second connection line comprises a transparent conducting oxide.

4. The display panel of claim 2, wherein the first connection line comprises a conductive material comprised in the plurality of second pixel circuits.

5. The display panel of claim 4, wherein each of the plurality of second pixel circuits comprises:
a first thin-film transistor comprising a first gate electrode and a first semiconductor layer, the first semiconductor layer comprising a silicon semiconductor; and
a second thin-film transistor comprising a second gate electrode and a second semiconductor layer, the second gate electrode being arranged on a different layer from a layer on which the first gate electrode is arranged, and the second semiconductor layer comprising an oxide semiconductor, and
the first connection line comprises a same material as at least one of the first gate electrode, the first semiconductor layer, the second gate electrode, or the second semiconductor layer.

6. The display panel of claim 1, further comprising an upper-organic insulating layer on the second inorganic insulating layer, wherein a thickness of the upper-organic insulating layer in the second display area is less than a thickness of the upper-organic insulating layer in the first display area.

7. The display panel of claim 1, further comprising an additional organic insulating layer in the second display area, wherein the additional organic insulating layer is not in the first display area.

8. The display panel of claim 1, wherein the second display area comprises a first sub area at a side of the second display area, a third sub-area apart from the first sub-area, and a second sub-area between the first sub-area and the third sub-area,
the plurality of connection lines in the first sub-area have a first width, the plurality of connection lines in the second sub-area have a second width, and the plurality of connection lines in the third sub-area have a third width, and
the third width is greater than the second width, and the second width is greater than the first width.

9. The display panel of claim 8, further comprising a third display area on opposite sides of the second display area, wherein the second pixel circuit is in the third display area, and the plurality of connection lines extend to the second display area from the third display area.

10. The display panel of claim 1, wherein the plurality of connection lines comprise a first connection line and a second connection line that are different from each other in width.

11. The display panel of claim 1, wherein the plurality of connection lines comprise a first connection line and a second connection line arranged on different layers from each other, the first connection line at least partially overlapping the second connection line.

12. A display panel comprising:
a substrate comprising a first display area comprising a plurality of first display elements, and a second display area comprising a plurality of second display elements;
a plurality of first pixel circuits in the first display area and respectively connected to the plurality of first display elements;
a plurality of second pixel circuits outside of the second display area and respectively connected to the plurality of second display elements;
a first connection line and a second connection line, each connecting the plurality of second display elements and the plurality of second pixel circuits to each other;
a first insulating layer in the second display area; and
a second insulating layer on the first insulating layer,
wherein the first connection line is on the first insulating layer,
the second connection line is on the second insulating layer,
the first connection line and the second connection line comprise different materials from each other, and
the first connection line and the second connection line are different from each other in width.

13. The display panel of claim 12, wherein the first connection line comprises a metal, and the second connection line comprises a transparent conducting oxide.

14. The display panel of claim 12, wherein the second display area comprises a first sub area at a side of the second display area, a third sub-area apart from the first sub area, and a second sub-area between the first sub-area and the third sub-area,
the first connection line in the first sub-area has a first width, the first connection line in the second sub-area has a second width, and the first connection line in the third sub-area has a third width, and
the third width is greater than the second width, and the second width is greater than the first width.

15. A display apparatus comprising:
a display panel comprising a first display area comprising a plurality of first display elements, and a second display area comprising a plurality of second display elements; and
a component below the display panel and corresponding to the second display area, wherein the display panel further comprises:
a substrate;
a plurality of first pixel circuits in the first display area and respectively connected to the plurality of first display elements;

a plurality of second pixel circuits outside of the second display area and respectively connected to the plurality of second display elements;
a plurality of connection lines connecting the plurality of second display elements and the plurality of second pixel circuits to each other;
a first inorganic insulating layer on the substrate;
a lower-organic insulating layer on the first inorganic insulating layer; and
a second inorganic insulating layer on the lower-organic insulating layer in the second display area,
wherein the second inorganic insulating layer comprises an opening exposing an upper surface of the lower-organic insulating layer, and the second inorganic insulating layer is disposed over at least one of the plurality of connection lines.

16. The display apparatus of claim 15, wherein the plurality of connection lines comprise a first connection line and a second connection line arranged on different layers from each other, and the first connection line and the second connection line comprise different materials from each other.

17. The display apparatus of claim 15, further comprising an upper-organic insulating layer on the second inorganic insulating layer, wherein a thickness of the upper-organic insulating layer in the second display area is less than a thickness of the upper-organic insulating layer in the first display area.

18. The display apparatus of claim 15, further comprising an additional organic insulating layer in the second display area, wherein the lower-organic insulating layer is in the first display area, and the additional organic insulating layer is not in the first display area.

19. The display apparatus of claim 15, wherein the plurality of connection lines comprise a first connection line and a second connection line that are different from each other in width.

20. The display apparatus of claim 15, wherein the plurality of connection lines comprise a first connection line and a second connection line arranged on different layers from each other, the first connection line at least partially overlapping the second connection line.

* * * * *